US012784857B2

(12) United States Patent
Shang et al.

(10) Patent No.: US 12,784,857 B2
(45) Date of Patent: Nov. 3, 2026

(54) MEMORY

(71) Applicant: CXMT Corporation, Hefei City (CN)

(72) Inventors: Weibing Shang, Hefei City (CN); Xiangyun Han, Hefei City (CN); Yifei Luo, Hefei City (CN); Xindi Wang, Hefei City (CN); Hangtian Ba, Hefei City (CN)

(73) Assignee: CXMT Corporation, Hefei City (CN)

( * ) Notice: Subject to any disclaimer, the term of this patent is extended or adjusted under 35 U.S.C. 154(b) by 134 days.

(21) Appl. No.: 18/968,317

(22) Filed: Dec. 4, 2024

(65) Prior Publication Data

US 2025/0174292 A1 May 29, 2025

Related U.S. Application Data

(63) Continuation of application No. PCT/CN2024/127589, filed on Oct. 28, 2024.

(30) Foreign Application Priority Data

Nov. 28, 2023 (CN) ......................... 202311634142.9

(51) Int. Cl.
*G11C 29/00* (2006.01)
*G11C 29/12* (2006.01)

(52) U.S. Cl.
CPC .................. *G11C 29/12005* (2013.01); *G11C 2029/1204* (2013.01)

(58) Field of Classification Search
CPC .................. G11C 29/12005; G11C 2029/1204
See application file for complete search history.

(56) References Cited

U.S. PATENT DOCUMENTS

| | | | | |
|---|---|---|---|---|
| 2006/0181943 A1* | 8/2006 | Kim | G11C 29/808 365/200 |
| 2006/0181946 A1* | 8/2006 | Park | G11C 7/18 365/207 |
| 2008/0056041 A1* | 3/2008 | Liaw | G11C 7/02 365/208 |
| 2018/0182449 A1 | 6/2018 | Kim et al. | |

FOREIGN PATENT DOCUMENTS

CN 116364149 A 6/2023

OTHER PUBLICATIONS

Extended European Search Report in U.S. Appl. No. 24/861,343, mailed on Dec. 2, 2025.

* cited by examiner

*Primary Examiner* — Min Huang
(74) *Attorney, Agent, or Firm* — Syncoda LLC; Feng Ma

(57) ABSTRACT

The present disclosure provides a memory. In the memory, each bit line in a non-edge memory array tile is coupled to a corresponding stress test power supply, and a stress test power supply corresponding to a first bit line is different from a stress test power supply corresponding to an adjacent second bit line. A first bit line in an edge memory array tile is coupled to a corresponding stress test power supply, and a stress test power supply corresponding to an odd-numbered first bit line is different from a stress test power supply corresponding to an even-numbered first bit line.

21 Claims, 12 Drawing Sheets

MEMORY

CROSS-REFERENCE TO RELATED APPLICATIONS

This application is a continuation of International Patent Application No. PCT/CN2024/127589 filed on Oct. 28, 2024, which claims priority to Chinese Patent Application No. 202311634142.9 filed on Nov. 28, 2023. The disclosures of the above-referenced applications are hereby incorporated by reference in their entirety.

BACKGROUND

With development of semiconductor technologies, an integration level requirement and a performance standard for a memory are gradually becoming high. Therefore, an internal circuit structure is gradually optimized. Providing a matching test method for an optimized internal circuit structure is also a problem to be resolved.

SUMMARY

The present disclosure relates to the field of semiconductors, and in particular, to a memory.

Embodiments of the present disclosure provide a memory.

The technical solutions of the present disclosure are implemented as follows.

According to a first aspect, the present disclosure provides a memory. The memory includes N memory array tiles sequentially arranged in a first direction. N is a natural number. Each of the memory array tiles includes multiple first bit lines and multiple second bit lines, and the first bit lines and the second bit lines are alternately arranged in a second direction. The first bit line is electrically isolated from an adjacent second bit line for a non-edge memory array tile. The first bit line is electrically connected to an adjacent second bit line on a first side and the first bit line is electrically isolated from an adjacent second bit line on a second side for an edge memory array tile. The first side and the second side are two opposite sides in the second direction. The memory array tiles are numbered in the first direction. In each of the memory array tiles, the first bit lines are numbered in the second direction and the second bit lines are numbered in the second direction. Each bit line in the non-edge memory array tile is coupled to a corresponding stress test power supply, and a stress test power supply corresponding to the first bit line is different from a stress test power supply corresponding to the adjacent second bit line. The first bit line in the edge memory array tile is coupled to a corresponding stress test power supply, and a stress test power supply corresponding to an odd-numbered first bit line is different from a stress test power supply corresponding to an even-numbered first bit line.

In some embodiments, a first one of bit lines in the odd-numbered memory array tile is a second bit line, and a first one of bit lines in the even-numbered memory array tile is a first bit line. Readout amplifier modules are distributed between every two memory array tiles, and each of the readout amplifier modules includes multiple sense amplifiers sequentially arranged in the second direction. A first terminal of each of the sense amplifiers is connected to one of the second bit lines on a third side through a first offset cancellation switch. A second terminal of the sense amplifier is connected to one of the second bit lines on the third side through a first isolation switch. The second terminal of the sense amplifier is further connected to one of the first bit lines on a fourth side through a second offset cancellation switch. The first terminal of the sense amplifier is further connected to one of the first bit lines on the fourth side through a second isolation switch. The third side and the fourth side are two opposite sides in the first direction. The first terminal or the second terminal of each sense amplifier is further connected to a precharge power supply through a corresponding precharge switch, so that each bit line is coupled to a precharge power supply.

In some embodiments, the precharge power supply coupled to the bit line in the non-edge memory array tile is adopted as the stress test power supply. The first bit line in the edge memory array tile is further coupled to a respective edge test power supply through a first test switch, and the edge test power supply coupled to the first bit line is adopted as the stress test power supply.

In some embodiments, the bit line in the non-edge memory array tile is further coupled to a respective precharge power supply through a column gating switch and a second test switch. The first bit line in the edge memory array tile is further coupled to a respective precharge power supply through a column gating switch and a second test switch. The precharge power supply coupled to each bit line in each memory array tile is adopted as the stress test power supply.

In some embodiments, the bit line in the non-edge memory array tile is further coupled to a respective preset test power supply through a column gating switch and a second test switch. The first bit line in the edge memory array tile is further coupled to a respective preset test power supply through a column gating switch and a second test switch. The preset test power supply coupled to each bit line in each memory array tile is adopted as the stress test power supply.

In some embodiments, the readout amplifier modules are numbered in the first direction. The first terminal or the second terminal of the sense amplifier in an odd-numbered readout amplifier module is connected to a first precharge power supply through a corresponding precharge switch, and the first terminal or the second terminal of the sense amplifier in an even-numbered readout amplifier module is connected to a second precharge power supply through a corresponding precharge switch, so that the stress test power supply corresponding to the first bit line is different from the stress test power supply corresponding to the adjacent second bit line.

In some embodiments, for the edge memory array tile, the odd-numbered first bit line is connected to a first edge test power supply through a respective first test switch, and the even-numbered first bit line is connected to a second edge test power supply through a respective first test switch. Alternatively, for a first memory array tile, the odd-numbered first bit line is connected to a first edge test power supply through a respective first test switch and the even-numbered first bit line is connected to a second edge test power supply through a respective first test switch, and for a last memory array tile, the odd-numbered first bit line is connected to a second edge test power supply through a respective first test switch and the even-numbered first bit line is connected to a first edge test power supply through a respective first test switch.

In some embodiments, the memory is configured to: control the first edge test power supply to be at a first voltage value, the second edge test power supply to be at a second voltage value, the first precharge power supply to be at a third voltage value, and the second precharge power supply to be at a fourth voltage value, and perform a bit line stress test operation; and control the first edge test power supply to be at the second voltage value, the second edge test power supply to be at the first voltage value, the first precharge power supply to be at the fourth voltage value, and the second precharge power supply to be at the third voltage value, and perform the bit line stress test operation. The first voltage value is different from the second voltage value, and the third voltage value is different from the fourth voltage value. In the bit line stress test operation, all first test switches are in an on state, isolation switches and offset cancellation switches between the edge memory array tile and an adjacent readout amplifier module are all in an off state, and other isolation switches, other offset cancellation switches, and all precharge switches are all in an on state.

In some embodiments, the bit line in the edge memory array tile is electrically connected to an adjacent sense amplifier through the first offset cancellation switch or the first isolation switch. The memory further includes: a command control circuit, configured to generate a test enable signal, an initial isolation signal, and an initial offset cancellation signal, the test enable signal, the initial isolation signal, and the initial offset cancellation signal all being in a valid state when the memory is indicated to perform the bit line stress test operation; a first preprocessing circuit, configured to generate a first edge isolation signal and a second edge isolation signal based on an edge test parameter group and the initial isolation signal, and generate a first edge offset cancellation signal and a second edge offset cancellation signal based on the edge test parameter group and the initial offset cancellation signal; and a second preprocessing circuit, configured to generate a first internal isolation signal and a second internal isolation signal based on an internal test parameter group and the initial isolation signal, and generate a first internal offset cancellation signal and a second internal offset cancellation signal based on the internal test parameter group and the initial offset cancellation signal. All the first test switches are controlled by the test enable signal. The first isolation switch, the second isolation switch, the first offset cancellation switch, and the second offset cancellation switch between an edge readout amplifier module and an adjacent memory array tile are controlled by the first edge isolation signal, the second edge isolation signal, the first edge offset cancellation signal, and the second edge offset cancellation signal in a one-to-one correspondence. The first isolation switch, the second isolation switch, the first offset cancellation switch, and the second offset cancellation switch between a non-edge readout amplifier module and an adjacent memory array tile are correspondingly controlled by the first internal isolation signal, the second internal isolation signal, the first internal offset cancellation signal, and the second internal offset cancellation signal.

In some embodiments, the edge test parameter group includes a first test parameter and a second test parameter. The internal test parameter group includes a third test parameter and a fourth test parameter. The second edge isolation signal and the second edge offset cancellation signal have the same levels as the initial isolation signal and the initial offset cancellation signal in a one-to-one correspondence if the first test parameter is in a first state, or both the second edge isolation signal and the second edge offset cancellation signal are invalid if the first test parameter is in a second state. The first edge isolation signal and the first edge offset cancellation signal have the same levels as the initial isolation signal and the initial offset cancellation signal in a one-to-one correspondence if the second test parameter is in a first state, or both the first edge isolation signal and the first edge offset cancellation signal are invalid if the second test parameter is in a second state. The first internal isolation signal and the first internal offset cancellation signal have the same levels as the initial isolation signal and the initial offset cancellation signal in a one-to-one correspondence if the fourth test parameter is in a first state, or both the first internal isolation signal and the first internal offset cancellation signal are invalid if the fourth test parameter is in a second state. The second internal isolation signal and the second internal offset cancellation signal have the same levels as the initial isolation signal and the initial offset cancellation signal in a one-to-one correspondence if the third test parameter is in a first state, or both the second internal isolation signal and the second internal offset cancellation signal are invalid if the third test parameter is in a second state. In a process in which the memory is indicated to perform the bit line stress test operation, the second test parameter is in a second state, and the first test parameter, the third test parameter, and the fourth test parameter are each in a first state.

In some embodiments, the first state is a high level, and the second state is a low level. The first preprocessing circuit includes: a first AND gate, two input terminals thereof respectively receiving the first test parameter and the initial isolation signal, and an output terminal thereof outputting the second edge isolation signal; a second AND gate, two input terminals thereof respectively receiving the second test parameter and the initial isolation signal, and an output terminal thereof outputting the first edge isolation signal; a third AND gate, two input terminals thereof respectively receiving the first test parameter and the initial offset cancellation signal, and an output terminal thereof outputting the second edge offset cancellation signal; and a fourth AND gate, two input terminals thereof respectively receiving the second test parameter and the initial offset cancellation signal, and an output terminal thereof outputting the first edge offset cancellation signal.

In some embodiments, the bit line in the first memory array tile is electrically connected to an adjacent sense amplifier through the first offset cancellation switch or the first isolation switch. The bit line in the last memory array tile is electrically connected to an edge sense amplifier through the second offset cancellation switch or the second isolation switch. The memory further includes: a command control circuit, configured to generate a test enable signal, an initial isolation signal, and an initial offset cancellation signal, the test enable signal, the initial isolation signal, and the initial offset cancellation signal all being in a valid state when the memory is indicated to perform the bit line stress test operation; a second preprocessing circuit, configured to generate a first internal isolation signal and a second internal isolation signal based on an internal test parameter group and the initial isolation signal, and generate a first internal offset cancellation signal and a second internal offset cancellation signal based on the internal test parameter group and the initial offset cancellation signal; a third preprocessing circuit, configured to generate a first head terminal isolation signal and a second head terminal isolation signal based on a head terminal test parameter group and the initial isolation signal, and generate a first head terminal offset cancellation signal and a second head terminal offset cancellation signal based on the head terminal test parameter group and the initial offset cancellation signal; and a fourth preprocessing circuit, configured to generate a first tail terminal isolation signal and a second tail terminal isolation signal based on a tail terminal test parameter group and the initial isolation signal, and generate a first tail terminal offset cancellation signal and a second tail terminal offset cancellation signal based on the tail terminal test parameter group and the initial offset cancellation signal. All the first test switches are controlled by the test enable signal. The first isolation switch, the second isolation switch, the first offset cancellation switch, and the second offset cancellation switch between a first readout amplifier module and an adjacent memory array tile are controlled by the first head terminal isolation signal, the second head terminal isolation signal, the first head terminal offset cancellation signal, and the second head terminal offset cancellation signal in a one-to-one correspondence. The first isolation switch, the second isolation switch, the first offset cancellation switch, and the second offset cancellation switch between a last readout amplifier module and an adjacent memory array tile are controlled by the first tail terminal isolation signal, the second tail terminal isolation signal, the first tail terminal offset cancellation signal, and the second tail terminal offset cancellation signal in a one-to-one correspondence. The first isolation switch, the second isolation switch, the first offset cancellation switch, and the second offset cancellation switch between a non-edge readout amplifier module and an adjacent memory array tile are controlled by the first internal isolation signal, the second internal isolation signal, the first internal offset cancellation signal, and the second internal offset cancellation signal in a one-to-one correspondence.

In some embodiments, the internal test parameter group includes at least a third test parameter and a fourth test parameter. The head terminal test parameter group includes a fifth test parameter and a sixth test parameter. The tail terminal test parameter group includes a seventh test parameter and an eighth test parameter. The second internal isolation signal and the second internal offset cancellation signal have the same levels as the initial isolation signal and the initial offset cancellation signal in a one-to-one correspondence if the third test parameter is in a first state, or both the second internal isolation signal and the second internal offset cancellation signal are invalid if the third test parameter is in a second state. The first internal isolation signal and the first internal offset cancellation signal have the same levels as the initial isolation signal and the initial offset cancellation signal in a one-to-one correspondence if the fourth test parameter is in a first state, or both the first internal isolation signal and the first internal offset cancellation signal are invalid if the fourth test parameter is in a second state. The second head terminal isolation signal and the second head terminal offset cancellation signal have the same levels as the initial isolation signal and the initial offset cancellation signal in a one-to-one correspondence if the fifth test parameter is in a first state, or both the second head terminal isolation signal and the second head terminal offset cancellation signal are invalid if the fifth test parameter is in a second state. The first head terminal isolation signal and the first head terminal offset cancellation signal have the same levels as the initial isolation signal and the initial offset cancellation signal in a one-to-one correspondence if the sixth test parameter is in a first state, or both the first head terminal isolation signal and the first head terminal offset cancellation signal are invalid if the sixth test parameter is in a second state. The second tail terminal isolation signal and the second tail terminal offset cancellation signal have the same levels as the initial isolation signal and the initial offset cancellation signal in a one-to-one correspondence if the seventh test parameter is in a first state, or both the second tail terminal isolation signal and the second tail terminal offset cancellation signal are invalid if the seventh test parameter is in a second state. The first tail terminal isolation signal and the first tail terminal offset cancellation signal have the same levels as the initial isolation signal and the initial offset cancellation signal in a one-to-one correspondence if the eighth test parameter is in a first state, or both the first tail terminal isolation signal and the first tail terminal offset cancellation signal are invalid if the eighth test parameter is in a second state. In a process in which the memory is indicated to perform the bit line stress test operation, the sixth test parameter and the seventh test parameter are each in a second state, and the third test parameter, the fourth test parameter, the fifth test parameter, and the eighth test parameter are each in a first state.

In some embodiments, the first state is a high level, and the second state is a low level. The second preprocessing circuit includes: a fifth AND gate, two input terminals thereof respectively receiving the third test parameter and the initial isolation signal, and an output terminal thereof outputting the second internal isolation signal; a sixth AND gate, two input terminals thereof respectively receiving the fourth test parameter and the initial isolation signal, and an output terminal thereof outputting the first internal isolation signal; a seventh AND gate, two input terminals thereof respectively receiving the third test parameter and the initial offset cancellation signal, and an output terminal thereof outputting the second internal offset cancellation signal; and an eighth AND gate, two input terminals thereof respectively receiving the fourth test parameter and the initial offset cancellation signal, and an output terminal thereof outputting the first internal offset cancellation signal.

In some embodiments, the first state is a high level, and the second state is a low level. The third preprocessing circuit includes: a ninth AND gate, two input terminals thereof respectively receiving the fifth test parameter and the initial isolation signal, and an output terminal thereof outputting the second head terminal isolation signal; a tenth AND gate, two input terminals thereof respectively receiving the sixth test parameter and the initial isolation signal, and an output terminal thereof outputting the first head terminal isolation signal; an eleventh AND gate, two input terminals thereof respectively receiving the fifth test parameter and the initial offset cancellation signal, and an output terminal thereof outputting the second head terminal offset cancellation signal; and a twelfth AND gate, two input terminals thereof respectively receiving the sixth test parameter and the initial offset cancellation signal, and an output terminal thereof outputting the first head terminal offset cancellation signal; The fourth preprocessing circuit includes: a thirteenth AND gate, two input terminals thereof respectively receiving the seventh test parameter and the initial isolation signal, and an output terminal thereof outputting the second tail terminal isolation signal; a fourteenth AND gate, two input terminals thereof respectively receiving the eighth test parameter and the initial isolation signal, and an output terminal thereof outputting the first tail terminal isolation signal; a fifteenth AND gate, two input terminals thereof respectively receiving the seventh test parameter and the initial offset cancellation signal, and an output terminal thereof outputting the second tail terminal offset cancellation signal; and a sixteenth AND gate, two input terminals thereof respectively receiving the eighth test parameter and the initial offset cancellation signal, and an output terminal thereof outputting the first tail terminal offset cancellation signal.

In some embodiments, the bit line in the non-edge memory array tile is coupled to a respective local data line through a respective column gating switch. Local data lines coupled to the second bit line in a non-edge odd-numbered memory array tile and the first bit line in a non-edge even-numbered memory array tile are further connected to a first precharge power supply through respective second test switches. Local data lines coupled to the first bit line in the non-edge odd-numbered memory array tile and the second bit line in the non-edge even-numbered memory array tile are further connected to a second precharge power supply through respective second test switches.

In some embodiments, the first bit line in the edge memory array tile is coupled to a respective local data line through a respective column gating switch. For the edge memory array tile, a local data line coupled to the odd-numbered first bit line is coupled to a second precharge power supply through the second test switch, and a local data line coupled to the even-numbered first bit line is coupled to a first precharge power supply through the second test switch. Alternatively, for a first memory array tile, a local data line coupled to the odd-numbered first bit line is coupled to a second precharge power supply through the second test switch, and a local data line coupled to the even-numbered first bit line is coupled to a first precharge power supply through the second test switch; and for a last memory array tile, a local data line coupled to the odd-numbered first bit line is coupled to a first precharge power supply through the second test switch, and a local data line coupled to the even-numbered second bit line is coupled to a first precharge power supply through the second test switch.

In some embodiments, the memory is configured to control all isolation switches, offset cancellation switches, and precharge switches to be in an off state, control all column gating switches and second test switches to be in an on state, and control the first precharge power supply to be at a first voltage value and the second precharge power supply to be at a second voltage value, to perform one time of bit line stress test; or control all isolation switches, offset cancellation switches, and precharge switches to be in an off state, control all column gating switches and second test switches to be in an on state, and control the first precharge power supply to be at a second voltage value and the second precharge power supply to be at a first voltage value, to perform another time of bit line stress test.

In some embodiments, each bit line in the non-edge memory array tile is coupled to a respective local data line through a respective column gating switch. Local data lines coupled to the second bit line in a non-edge odd-numbered memory array tile and the first bit line in a non-edge even-numbered memory array tile are coupled to a first preset test power supply through the second test switches. Local data lines coupled to the first bit line in the non-edge odd-numbered memory array tile and the second bit line in the non-edge even-numbered memory array tile are coupled to a second preset test power supply through the second test switches.

In some embodiments, the first bit line in the edge memory array tile is coupled to a respective local data line through a respective column gating switch. For the edge memory array tile, a local data line corresponding to the odd-numbered first bit line is coupled to a second preset test power supply through the second test switch, and a local data line corresponding to the even-numbered first bit line is coupled to a first preset test power supply through the second test switch. Alternatively, for a first memory array tile, a local data line corresponding to the odd-numbered first bit line is coupled to a second preset test power supply through the second test switch, and a local data line corresponding to the even-numbered first bit line is coupled to a first preset test power supply through the second test switch; and for a last memory array tile, a local data line corresponding to the odd-numbered first bit line is coupled to a first preset test power supply through the second test switch, and a local data line corresponding to the even-numbered first bit line is coupled to a second preset test power supply through the second test switch.

In some embodiments, the memory is configured to: control all isolation switches and offset cancellation switches to be in an off state, control all precharge switches to be in an on state, and control the precharge power supply to be at a fifth voltage value; and control all column gating switches and second test switches to be in an on state, and control the first preset test power supply to be at a first voltage value and the second preset test power supply to be at a second voltage value, to perform one time of bit line stress test; or control all isolation switches and offset cancellation switches to be in an off state, control all precharge switches to be in an on state, and control the precharge power supply to be at a fifth voltage value; and control all column gating switches and second test switches to be in an on state, and control the first preset test power supply to be at a second voltage value and the second preset test power supply to be at a first voltage value, to perform another time of bit line stress test. A voltage of the fifth voltage value is located between a voltage of the first voltage value and a voltage of the second voltage value.

In the memory provided in the embodiments of the present disclosure, the area of the edge memory array tile is reduced to half of the area of another memory array tile, so that the area of a chip can be reduced, and an integration level can be improved. In addition, for the memory, each bit line in the non-edge memory array tile is coupled to the stress test power supply and the first bit line in the edge memory array tile is coupled to the stress test power supply, so that two adjacent bit lines in the non-edge memory array tile are at different voltages and the odd-numbered first bit line and the even-numbered first bit line in the edge memory array tile are at different voltages, thereby efficiently implementing the bit line stress test, improving a test procedure of the memory of this structure, and ensuring as-shipped performance.

DETAILED DESCRIPTION

To make the objectives, technical solutions, and advantages of the present disclosure clearer, the technical solutions of the present disclosure are further described in detail below with reference to the accompanying drawings and the embodiments. The described embodiments should not be considered as limitations to the present disclosure. All other embodiments obtained by a person of ordinary skill in the art without creative efforts fall within the scope of the present disclosure.

The following descriptions relate to "some embodiments" describing a subset of all possible embodiments. However, it may be understood that "some embodiments" may be the same subset or different subsets of all the possible embodiments, and may be combined with each other when there is no conflict.

The following descriptions are added if descriptions such as "first/second" appear in the application document. In the following descriptions, involved terms "first/second/third" are merely for distinguishing between similar objects and do not represent specific rankings of the objects. It may be understood that "first/second/third" may be interchanged for a specific sequence or order if allowed, so that the embodiments of the present disclosure described herein can be implemented in a sequence other than those shown or described herein.

Unless otherwise defined, all technical and scientific terms employed in this specification have meanings the same as those commonly understood by a person skilled in the technical field of the present disclosure. The terms employed in this specification are merely intended to describe the embodiments of the present disclosure, but are not intended to limit the present disclosure.

Figure 1:
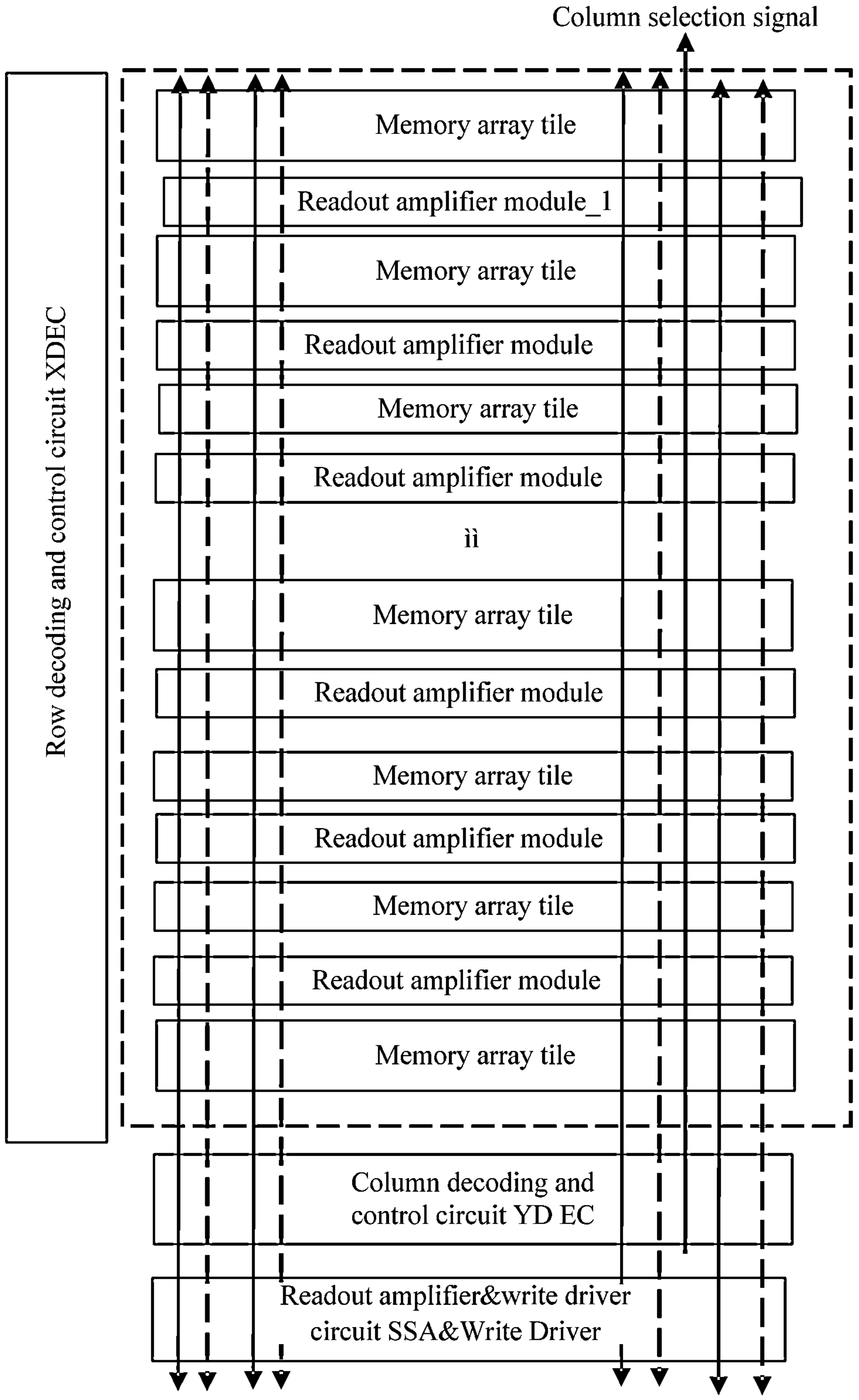
FIG. 1 is a schematic diagram 1 of a local structure of a DRAM.

A dynamic random access memory (DRAM) is adopted as an example. FIG. 1 is a schematic diagram of a local structure of a DRAM according to an embodiment of the present disclosure. As shown in FIG. 1, a core of the DRAM is a memory array tile (or referred to as a section), a readout amplifier module, a row decoding and control (XDEC) circuit, a column decoding and control (YDEC) circuit, and a second-stage readout amplifier (SSa) circuit and a write driver circuit. The second-stage readout amplifier circuit and the write driver circuit are collectively referred to as an SSa&Write Driver circuit.

The memory array tile includes a large quantity of memory cells (or referred to as cells), and data reading, data writing, or data refreshing processing can be performed on a selected memory cell through a word line (WL) and a bit line (BL).

Figure 2:
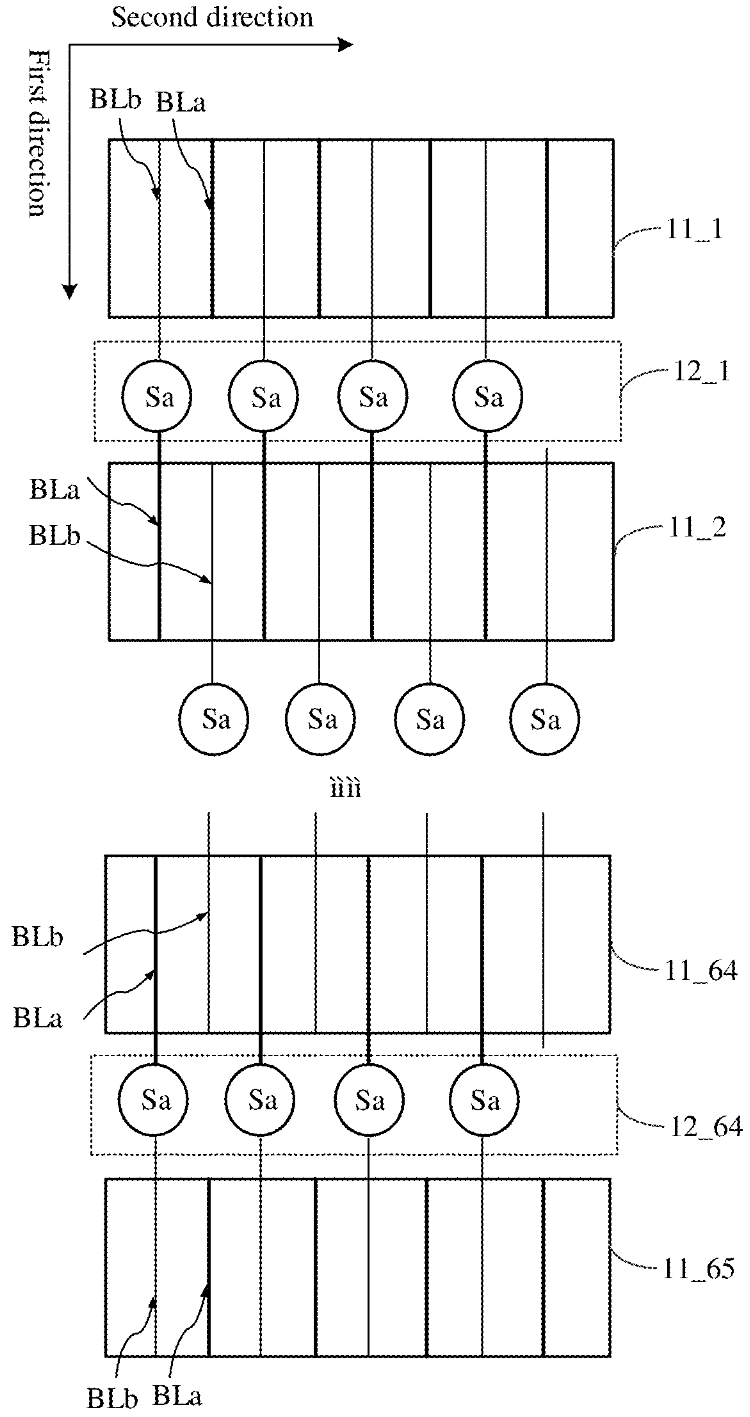
FIG. 2 is a schematic diagram 2 of a local structure of a DRAM.

Usually, 65 memory array tiles in a first direction may be adopted as repeatable structures in the memory (for example, half banks) FIG. 1 is further enlarged. Refer to FIG. 2. Bit lines in each memory array tile (for example, 11_1, 11_2, . . . , 11_65) are sequentially alternately referred to as first bit lines BLa and second bit lines BLb (FIG. 2 merely exemplarily shows some first bit lines BLa and second bit lines BLb). In particular, a first one of bit lines in an odd-numbered memory array tile (for example, 11_1, 11_3, . . . , 11_65) is a second bit line BLb; and a first one of bit lines in an even-numbered memory array tile (for example, 11_2, 11_4, . . . , 11_64) is a first bit line BLa. In particular, division of the first bit line BLa and the second bit line BLb is merely based on positions. Actually, the first bit line BLa and the second bit line BLb have completely the same physical structure.

A readout amplifier module (for example, 12_1, 12_2, . . . , 12_64) is disposed between every two memory array tiles. Each readout amplifier module includes multiple sense amplifiers (Sa). One terminal of each Sa is connected to a bit line in a memory array tile on one side (for example, an upper side), and the other terminal of the Sa is connected to a bit line in a memory array tile on the other side (for example, a lower side).

Refer to FIG. 1 and FIG. 2. A word line signal is provided by the XDEC to enable a target word line in the memory array tile. Then, a column selection signal is provided by the YDEC to control a corresponding Sa to operate, to exchange an electrical signal with a target bit line. Finally, data writing, reading, or refreshing is performed on a target memory cell.

As shown in FIG. 2, only half of bit lines in an edge memory array tile can be connected to adjacent readout amplifier modules. Consequently, the other half of the bit lines and memory cells corresponding thereto actually cannot be utilized. For example, the first bit lines BLa in the memory array tile 11_1 and the memory array tile 11_65 are not connected to the readout amplifier modules, resulting in a waste of memory cells and hindering improvement of an integration level of a chip.

The following describes the embodiments of the present disclosure in detail with reference to the accompanying drawings.

Figure 3A:
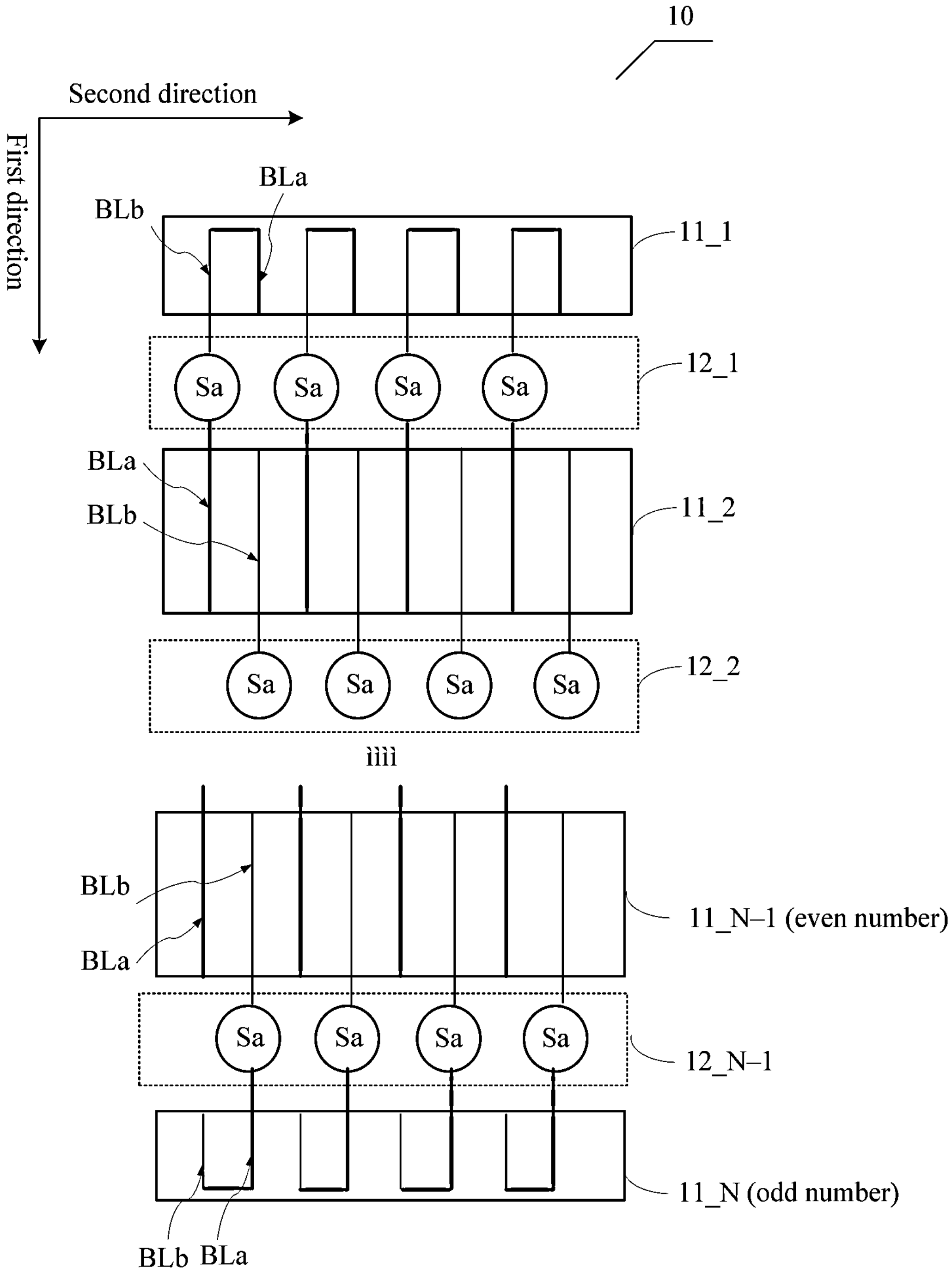
FIG. 3A is a schematic diagram 1 of a local structure of a memory according to an embodiment of the present disclosure.
Figure 3B:
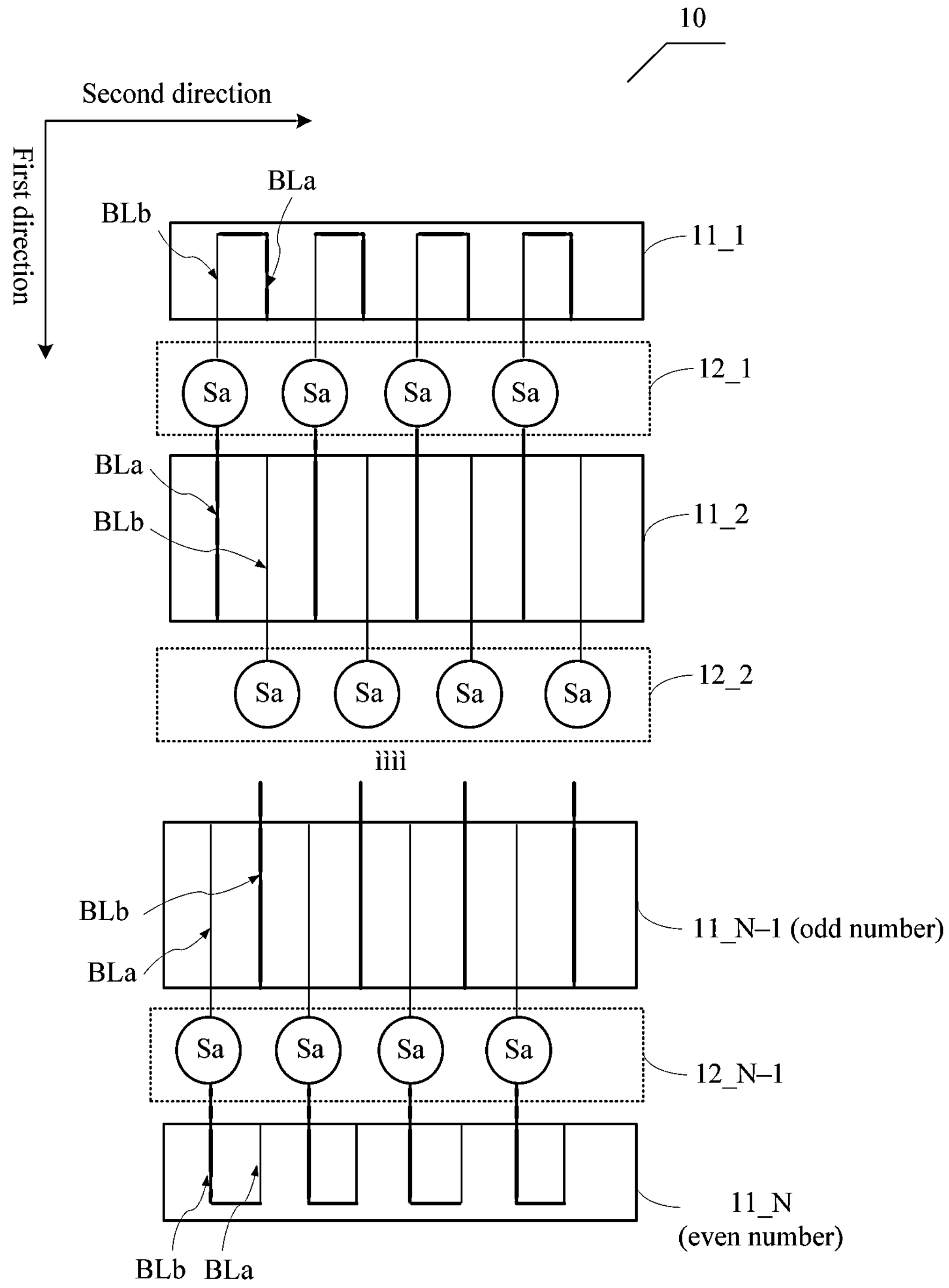
FIG. 3B is a schematic diagram 2 of a local structure of a memory according to an embodiment of the present disclosure.

In an embodiment of the present disclosure, FIG. 3A or FIG. 3B is a schematic diagram of a local structure of a memory 10 according to an embodiment of the present disclosure. As shown in FIG. 3A or FIG. 3B, the memory 10 includes N memory array tiles sequentially arranged in a first direction (for example, 11_1, 11_2, . . . , 11_N, that is, the memory array tiles are numbered in the first direction). Herein, N may be any natural number. FIG. 3A shows an example in which N is an odd number. FIG. 3B shows an example in which N is an even number.

Refer to FIG. 3A and FIG. 3B. Each of the memory array tiles includes multiple first bit lines BLa and multiple second bit lines BLb, and the first bit lines BLa and the second bit lines BLb are alternately arranged in a second direction. The first bit line BLa is electrically isolated from an adjacent second bit line BLb for a non-edge memory array tile (for example, 11_2, . . . , 11_N−1). The first bit line BLa is electrically connected to an adjacent second bit line BLb on a first side (for example, a left side in the second direction) and the first bit line BLa is electrically isolated from an adjacent second bit line BLb on a second side (for example, a right side in the second direction) for an edge memory array tile (for example, 11_1 and 11_N). That is, the first side and the second side are two opposite sides in the second direction.

Herein, the readout amplifier module in this embodiment of the present disclosure is applied to multiple signal amplification scenarios, such as a DRAM, a synchronous dynamic random access memory (SDRAM), a double data rate DRAM, and a low-power DRAM, and may be flexibly applied by a person skilled in the art.

It should be noted that the length of each bit line in the edge memory array tile (11_1 and 11_N) may be shortened by nearly half because two bit lines are essentially connected into one integrated bit line. Specifically, for the non-edge memory array tile, the distance between one end that is of each bit line and that is connected to the Sa and the other end of the bit line is denoted as L1. For the edge memory array tile, the distance between one end that is of the integrated bit line (the first bit line+the second bit line) and that is connected to the Sa and the other end of the integrated bit line is denoted as L2. L1=L2.

Therefore, the area of the edge memory array tile (11_1 and 11_N) is reduced by nearly half compared with the area of the non-edge memory array tile (11_2, . . . , 11_N−1). Therefore, an integration level of the memory 10 is improved, and the overall area occupied by memory cells is reduced.

It should be noted that each memory array tile in FIG. 3A or FIG. 3B shows eight bit lines, but this is merely for an illustrative purpose. Actually, a quantity of bit lines in each memory array tile is large.

Subsequently, N=65 is adopted for illustration and description. Adaptive understanding may be made when N is an even number or another value.

In particular, a bit line stress (BL stress) test is an important performance test item of the memory 10. A test method is that different voltages are applied to adjacent bit lines and whether memory cells can operate normally is observed subsequently. For the memory 10 shown in FIG. 3A or FIG. 3B, a bit line structure of the edge memory array tile (11_1 and 11_N) is different from a bit line structure of the non-edge memory array tile (11_2, . . . , 11_N−1). Consequently, BL stress cannot be implemented according to a conventional method.

Therefore, this embodiment of the present disclosure further provides a BL stress test method for the memory 10 shown in FIG. 3A or FIG. 3B.

For ease of description, for FIG. 3A or FIG. 3B, a first one of bit lines in an odd-numbered memory array tile (11_1, 11_3, 11_5, . . . ) is a second bit line BLb; and a first one of bit lines in an even-numbered memory array tile (11_2, 11_4, 11_6, . . . ) is a first bit line BLa. The first bit lines BLa in each memory array tile are sequentially numbered in the second direction, and the second bit lines BLb in each memory array tile are sequentially numbered in the second direction.

Figure 4:
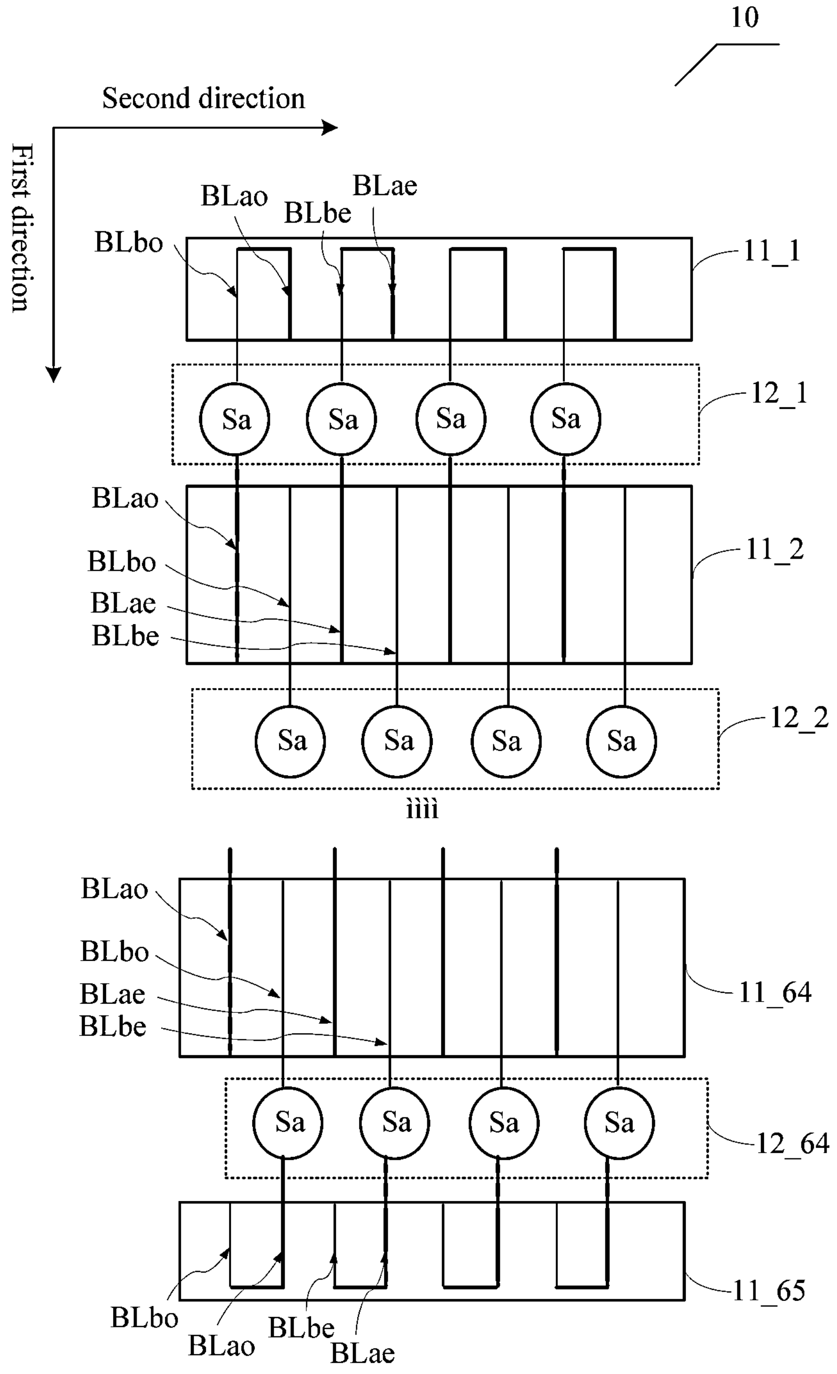
FIG. 4 is a schematic diagram 3 of a local structure of a memory according to an embodiment of the present disclosure.

For example, an odd number is adopted as a start point for numbering. Refer to FIG. 4 (N=65 is adopted as an example, and adaptive understanding may be made when Nis another value). The bit lines in the memory array tile 11_1 in the second direction are sequentially BLbo, BLao, BLbe, and BLae, and the bit lines in the memory array tile 11_2 in the second direction are sequentially BLao, BLbo, BLae, BLbe, . . . .

Figure 5:
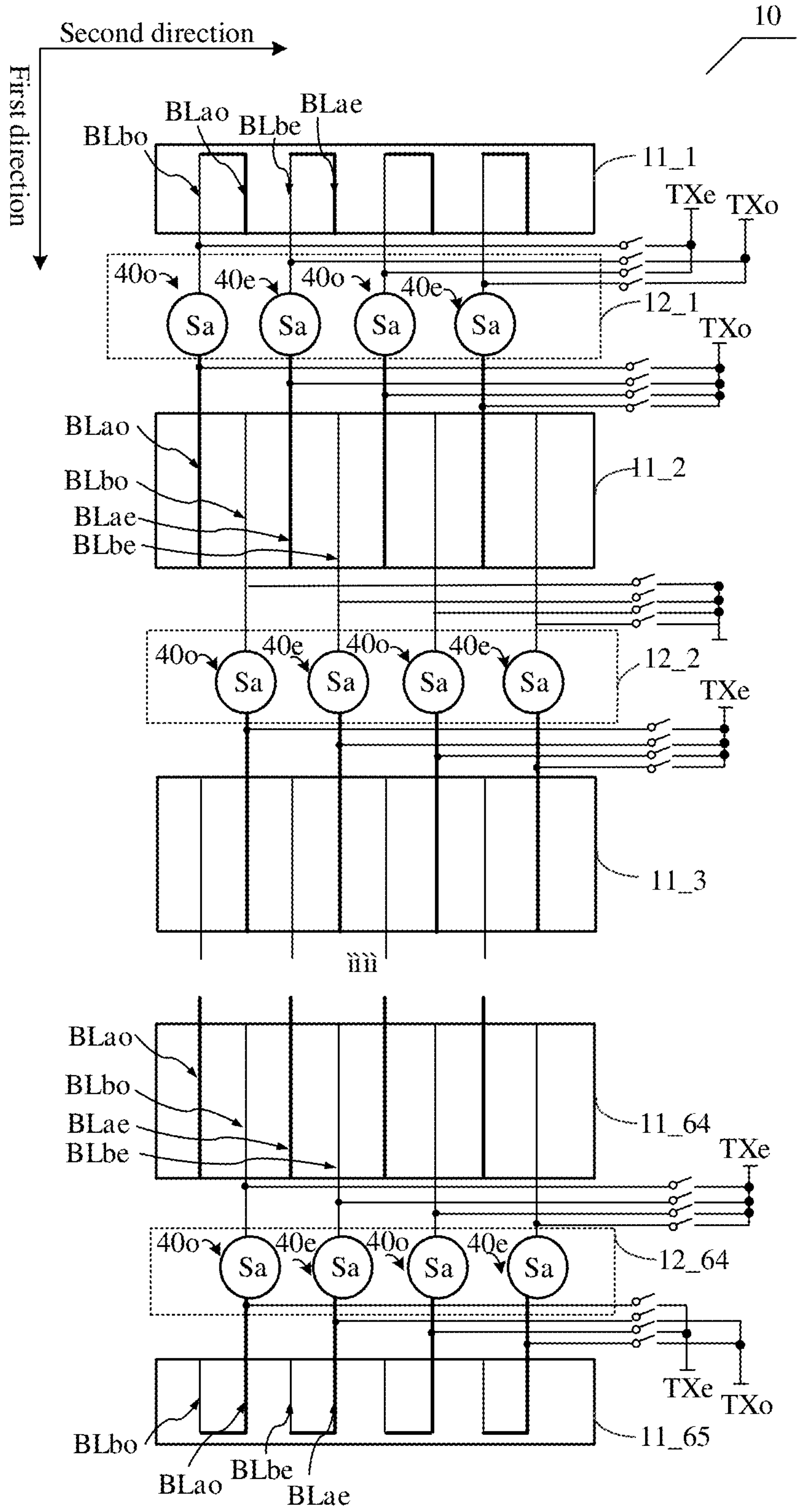
FIG. 5 is a schematic diagram 4 of a local structure of a memory according to an embodiment of the present disclosure.

In the memory 10 provided in this embodiment of the present disclosure, each bit line in the non-edge memory array tile (11_2, 11_3, . . . , 11_64) is coupled to a corresponding stress test power supply TXo/TXe, and a stress test power supply corresponding to the first bit line BLa is different from a stress test power supply corresponding to an adjacent second bit line BLb. Refer to FIG. 5. For example, for the memory array tile 11_2, a stress test power supply corresponding to BLa is TXo and a stress test power supply corresponding to BLb is TXe; and for the memory array tile 11_3, a stress test power supply corresponding to BLa is TXe and a stress test power supply corresponding to BLb is TXo.

The first bit line in the edge memory array tile (11_1 and 11_65) is coupled to a corresponding stress test power supply, and a stress test power supply corresponding to an odd-numbered first bit line BLao is different from a stress test power supply corresponding to an even-numbered first bit line BLae. It should be understood that, in FIG. 5, the first bit line BLa in the memory array tile is specifically coupled to the corresponding stress test power supply through BLb electrically connected thereto. FIG. 5 is merely adopted as an example. The stress test power supply corresponding to BLao is TXe, and the stress test power supply corresponding to BLae is TXo.

In particular, FIG. 5 is merely an example. In an actual scenario, the stress test power supply is designed according to multiple methods. For example, for the non-edge memory array tile, all the first bit lines are connected to TXo and all the second bit lines are connected to TXe.

Refer to FIG. 5. Readout amplifier modules are distributed between every two memory array tiles, and the readout amplifier modules are numbered in the first direction, that is, the readout amplifier modules are sequentially numbered as 12_1, 12_2, . . . , and 12_64 in the first direction.

Figure 6:
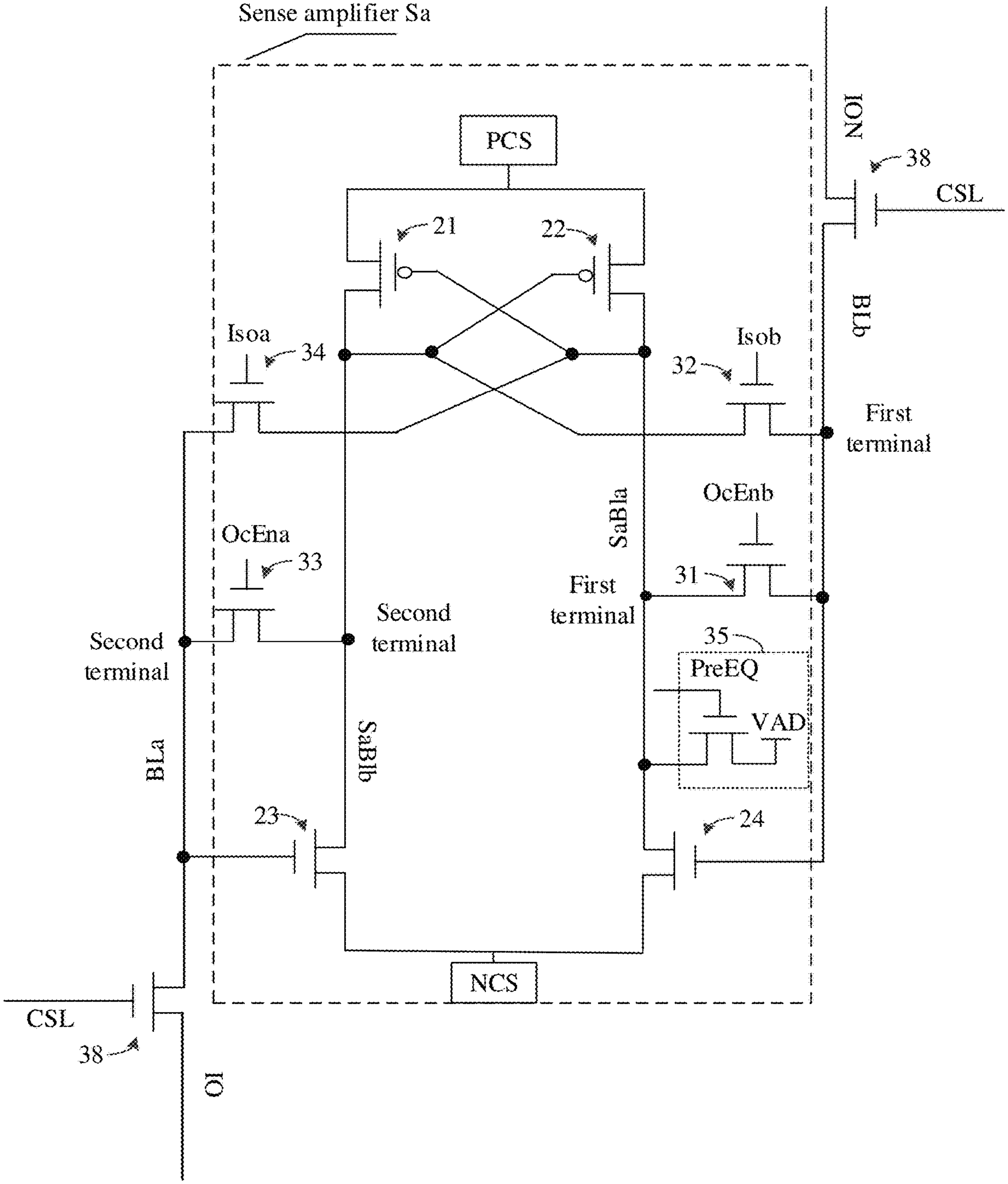
FIG. 6 is a schematic diagram of a structure of a sense amplifier according to an embodiment of the present disclosure.

The readout amplifier module includes multiple sense amplifiers Sa sequentially arranged in the second direction. The sense amplifiers of each readout amplifier module are numbered in the second direction. An odd-numbered sense amplifier Sa is represented as 400. An even-numbered sense amplifier Sa is represented as 40*e*. For a structure of each sense amplifier Sa, refer to FIG. 6. As shown in FIG. 6, the sense amplifier Sa includes a first transistor 21, a second transistor 22, a third transistor 23, and a fourth transistor 24 that are cross-coupled to each other. The drain of the first transistor 21 and the drain of the third transistor 23 are connected to a second complementary bit line SaBLb. The drain of the second transistor 22 and the drain of the fourth transistor 24 are connected to a first complementary bit line SaBLa. The gate of the third transistor 23 is connected to the first bit line BLa. The gate of the fourth transistor 24 is connected to the second bit line BLb. In addition, NCS refers to a pull-down module, and PCS refers to a pull-up module. This part does not affect understanding of the solutions of the present disclosure, and is not further described.

Refer to FIG. 6. A first terminal of the sense amplifier Sa is connected to one of the second bit lines BLb on a third side (for example, an upper side in the first direction) through a first offset cancellation switch 31, and a second terminal of the sense amplifier Sa is connected to one of the second bit lines BLb on the third side through a first isolation switch 32. The second terminal of the sense amplifier Sa is further connected to one of the first bit lines BLa on a fourth side (for example, a lower side in the first direction) through a second offset cancellation switch 33, and the first terminal of the sense amplifier Sa is further connected to one of the first bit lines BLa on the fourth side through a second isolation switch 34. That is, the third side and the fourth side are two opposite sides in the first direction.

For example, the first offset cancellation switch 31, the second offset cancellation switch 33, the first isolation switch 32, and the second isolation switch 34 are all transistors.

The first terminal or the second terminal of each sense amplifier Sa is further connected to a precharge power supply VAD through a corresponding precharge switch 35. It should be understood that in FIG. 6, the second bit line BLb is coupled to the precharge power supply VAD through the first offset cancellation switch 31 and the precharge switch 35, and the first bit line BLa is coupled to the precharge power supply VAD through the second isolation switch 34 and the precharge switch 35, that is, each bit line is coupled to a precharge power supply VAD, and two bit lines connected to the same sense amplifier share the same precharge power supply VAD.

In this way, in the memory provided in this embodiment of the present disclosure, the area of the edge memory array tile is reduced to half of the area of another memory array tile. In addition, each bit line in the memory array tile has a respective stress test power supply, thereby efficiently implementing the bit line stress test.

In a first specific embodiment, the precharge power supply coupled to the bit line in the non-edge memory array tile (11_2, 11_3, . . . , 11_64) is adopted as the stress test power supply. However, the first bit line in the edge memory array tile (11_1 and 11_65) is further coupled to a respective edge test power supply through a first test switch, and the edge test power supply coupled to the first bit line is adopted as the stress test power supply.

The following provides specific description.

Figure 7:
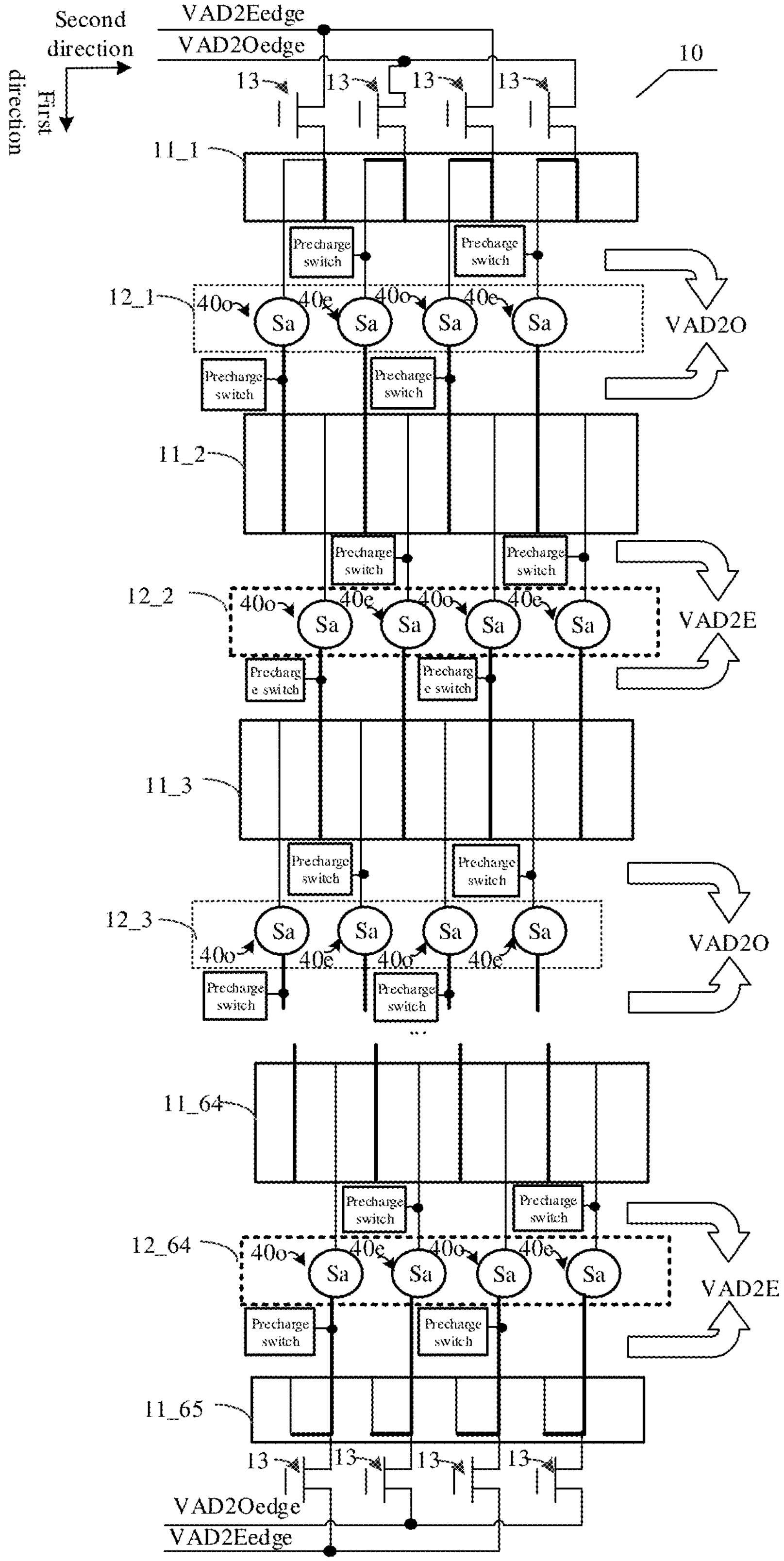
FIG. 7 is a schematic diagram 5 of a local structure of a memory according to an embodiment of the present disclosure.

Refer to FIG. 7. The memory 10 includes two groups of precharge power supplies VAD. One group of precharge power supplies refers to first precharge power supplies VAD2O, and the other group of precharge power supplies refers to second precharge power supplies VAD2E. For only the non-edge memory array tile (11_2, 11_3, . . . , 11_64), the first precharge power supply VAD2O is adopted as the stress test power supply TXo, and the second precharge power supply VAD2E is adopted as the stress test power supply TXe.

On the one hand, as shown in FIG. 7, the first terminal or the second terminal of the sense amplifier Sa in an odd-numbered readout amplifier module (12_1, 12_3, . . . , 12_63) is further connected to the first precharge power supply VAD2O through the precharge switch 35. The first terminal or the second terminal of the sense amplifier Sa in an even-numbered readout amplifier module (12_2, 12_4, . . . , 12_64) is further connected to the second precharge power supply VAD2E through the precharge switch 35. Therefore, the stress test power supply corresponding to the first bit line BLa is different from the stress test power supply corresponding to the adjacent second bit line BLb.

It should be understood that, in FIG. 7, the second terminal of the odd-numbered sense amplifier 40*o* is connected to a corresponding precharge power supply through the precharge switch 35, and the first terminal of the even-numbered sense amplifier 40*e* is connected to a corresponding precharge power supply through the precharge switch 35. However, this does not constitute a corresponding limitation, provided that it is ensured that the precharge power supply corresponding to the sense amplifier Sa in the odd-numbered readout amplifier module is the first precharge power supply VAD2O, and the precharge power supply corresponding to the sense amplifier Sa in the even-numbered readout amplifier module is the second precharge power supply VAD2E.

On the other hand, the memory 10 further includes two groups of edge test power supplies. One group of edge test power supplies is referred to as first edge test power supplies VAD2Eedge, and the other group of edge test power supplies is referred to as second edge test power supplies VAD2Oedge. For the edge memory array tile (11_1 and 11_65), the first edge test power supply VAD2Eedge is adopted as the stress test power supply TXe, and the second edge test power supply VAD2Oedge is adopted as the stress test power supply TXo.

In one case, refer to FIG. 7. For the edge memory array tile (11_1 and 11_65), the odd-numbered first bit line BLao is connected to the first edge test power supply VAD2Eedge through a respective first test switch 13, and the even-numbered first bit line BLae is connected to the second edge test power supply VAD2Oedge through a respective first test switch 13, so that the stress test power supply corresponding to the odd-numbered first bit line BLao is different from the stress test power supply corresponding to the even-numbered first bit line BLae.

In another case, for a first memory array tile 11_1, the odd-numbered first bit line BLao is connected to the first edge test power supply VAD2Eedge through a respective test switch, and the even-numbered first bit line BLae is connected to the second edge test power supply VAD2Oedge through a respective test switch. For a last memory array tile 11_65, the odd-numbered first bit line BLao is connected to the second edge test power supply VAD2Oedge through a respective test switch, and the even-numbered first bit line BLae is connected to the first edge test power supply VAD2Eedge through a respective test switch. Therefore, a test power supply corresponding to the odd-numbered first bit line BLao is different from a test power supply corresponding to the even-numbered first bit line BLae.

In this way, adjacent bit lines in the non-edge memory array tile are connected to different precharge power supplies, and the odd-numbered first bit line BLao and the even-numbered first bit line BLae in the edge memory array tile are connected to different edge test power supplies, thereby facilitating implementation of the bit line stress test BL stress, and ensuring product performance of the memory.

Based on the structure in FIG. 7, a process in which the memory 10 performs BL stress on the non-edge memory array tile is as follows:

First, the memory 10 is specifically configured to control the first edge test power supply VAD2Eedge to be at a first voltage value, the second edge test power supply VAD2Oedge to be at a second voltage value, the first precharge power supply VAD2O to be at a third voltage value, and the second precharge power supply VAD2E to be at a fourth voltage value, and perform a bit line stress test operation. The first voltage value is different from the second voltage value, and the third voltage value is different from the fourth voltage value. For example, the first voltage value is a high level and the second voltage value is a low level, and vice versa; and the third voltage value is a high level and the fourth voltage value is a low level, and vice versa.

In addition, in the bit line stress test operation, all first test switches 13 are in an on state, isolation switches and offset cancellation switches between the edge memory array tile and an adjacent readout amplifier module are all in an off state, and other isolation switches, other offset cancellation switches, and all precharge switches are all in an on state.

It is assumed that the first voltage value=the third voltage value=a high level, the second voltage value=the fourth voltage value=a low level, and a memory structure shown in FIG. 7 is adopted as an example for specific description.

In this way, on the one hand, isolation switches and offset cancellation switches between the non-edge memory array tile and the adjacent readout amplifier module are all in an on state. Therefore, the bit line therein is electrically communicated with a respective precharge power supply through a corresponding sense amplifier. To be specific:

(1) In a non-edge odd-numbered memory array tile (for example, the memory array tile 11_3, 11_5, . . . , or 11_63), the first bit lines BLa are all at a low level (precharged through VAD2E), and the second bit lines BLb are all at a high level (precharged through VAD2O).

(2) In a non-edge even-numbered memory array tile (for example, the memory array tile 11_2, 11_4, . . . , or 11_64), the first bit lines BLa are all at a high level (precharged through VAD2O), and the second bit lines BLb are all at a low level (precharged through VAD2E).

On the other hand, because the isolation switches and the offset cancellation switches between the edge memory array tile and the adjacent readout amplifier module are all in the off state, the first bit line BLa in the edge memory array tile is not communicated with a corresponding precharge power supply. However, because all the first test switches 13 are turned on, the first bit line BLa in the edge memory array tile is communicated with a corresponding test power supply. To be specific:

(3) For the memory array tiles 11_1 and 11_65, both the odd-numbered first bit line BLao and the second bit line BLbo electrically connected thereto are at a high level (precharged through VAD2Eedge), and both the even-numbered first bit line BLa and the second bit line BLb electrically connected thereto are at a low level (precharged through VAD2OEdge).

In this way, adjacent bit lines in all the memory array tiles can be at different level values by only controlling voltage values of power supply terminals and operation states of corresponding switches, thereby facilitating execution of the bit line stress test.

In some embodiments, the memory 10 is further configured to control the first edge test power supply VAD2Eedge to be at the second voltage value, the second edge test power supply VAS2Oedge to be at the first voltage value, the first precharge power supply VAD2O to be at the fourth voltage value, and the second precharge power supply VAD2E to be at the third voltage value, and perform the bit line stress test operation.

It is assumed that the first voltage value=the third voltage value=a high level, the second voltage value=the fourth voltage value=a low level, and a memory structure shown in FIG. 7 is adopted as an example for specific description.

(4) In the non-edge odd-numbered memory array tile (for example, the memory array tile 11_3, 11_5, . . . , or 11_63), the first bit lines BLa are all at a high level (precharged through VAD2E), and the second bit lines BLb are all at a low level (precharged through VAD2O).

(5) In the non-edge even-numbered memory array tile (for example, the memory array tile 11_2, 11_4, . . . , or 11_64), the first bit lines BLa are all at a low level (precharged through VAD2O), and the second bit lines BLb are all at a high level (precharged through VAD2E).

(6) For the memory array tiles 11_1 and 11_65, both the odd-numbered first bit line BLa and the second bit line BLb electrically connected thereto are at a low level (precharged through VAD2Eedge), and both the even-numbered first bit line BLa and the second bit line BLb electrically connected thereto are at a high level (precharged through VAD2OEdge).

In this way, the precharge power supplies are classified into two groups for management, and independent test power supplies are additionally disposed for the bit lines in the edge memory array tile, thereby efficiently implementing the bit line stress test.

To implement the foregoing test method, refer to FIG. 6. The gate of the first offset cancellation switch 31 and the gate of the second offset cancellation switch 33 are respectively connected to different control signals OcEnb and OcEna, and the gate of the first isolation switch 32 and the gate of the second isolation switch 34 are respectively connected to different control signals Isob and Isoa.

Ir can be learned from FIG. 6 and FIG. 7 that the readout amplifier module 12_1 is connected to the memory array tile 11_1 through the first offset cancellation switch 31 and the first isolation switch 32, but the readout amplifier module 12_64 is connected to the memory array tile 11_65 through the second offset cancellation switch 33 and the second isolation switch 34. To implement the foregoing test method more conveniently, in a specific embodiment, some definitions (for example, definitions of the first bit lines BLa and the second bit lines BLb in the last and second last memory array tiles, or definitions of the offset cancellation switches and the isolation switches in the readout amplifier module 12_64) are changed, so that the readout amplifier module 12_64 is also connected to the memory array tile 11_65 through the first offset cancellation switch 31 and the first isolation switch 32.

That is, the bit line in the edge memory array tile is connected to an adjacent sense amplifier through the first offset cancellation switch 31 or the first isolation switch 32. Therefore, only the first offset cancellation switches 31 and the first isolation switches 32 that correspond to the readout amplifier module 12_1 and the readout amplifier module 12_64 need to be turned off, so that the edge memory array tiles can be electrically isolated from the adjacent sense amplifiers Sa. In this case, refer to FIG. 7. The memory 10 further includes a command control circuit (not shown in FIG. 8), a first preprocessing circuit 50, and a second preprocessing circuit 60. To be specific:

The command control circuit is configured to generate a test enable signal, an initial isolation signal IsoPre, and an initial offset cancellation signal OcPre. The test enable signal, the initial isolation signal IsoPre, and the initial offset cancellation signal OcPre are all in a valid state when the memory 10 is indicated to perform the bit line stress test operation.

The first preprocessing circuit 50 is configured to generate a first edge isolation signal IsobEdge and a second edge isolation signal IsoaEdge based on an edge test parameter group TmEdge<1:0> and the initial isolation signal IsoPre, and generate a first edge offset cancellation signal OcEnbEdge and a second edge offset cancellation signal OcEnaEdge based on the edge test parameter group TmEdge<1:0> and the initial offset cancellation signal OcPre.

The second preprocessing circuit 60 is configured to generate a first internal isolation signal IsobInter and a second internal isolation signal IsoaInter based on an internal test parameter group TmInter<1:0> and the initial isolation signal IsoPre, and generate a first internal offset cancellation signal OcEnbInter and a second internal offset cancellation signal OcEnaInter based on the internal test parameter group TmInter<1:0> and the initial offset cancellation signal OcPre.

The test enable signal is configured to control all the first test switches 13. In addition, (1) the first edge isolation signal IsobEdge is configured to control the first isolation switch 32 between an edge readout amplifier module and the edge memory array tile; (2) the second edge isolation signal IsoaEdge is configured to control the second isolation switch 34 between the edge readout amplifier module and the non-edge memory array tile; (3) the first edge offset cancellation signal OcEnbEdge is configured to control the first offset cancellation switch 31 between the edge readout amplifier module and the edge memory array tile; (4) the second edge offset cancellation signal OcEnaEdge is configured to control the second offset cancellation switch 33 between the edge readout amplifier module and the non-edge memory array tile; (5) the first internal isolation signal IsobInter is configured to control the first isolation switch 32 between a non-edge readout amplifier module and an adjacent memory array tile; (6) the second internal isolation signal IsoaInter is configured to control the second isolation switch 34 between the non-edge readout amplifier module and the adjacent memory array tile; (7) the first internal offset cancellation signal OcEnbInter is configured to control the first offset cancellation switch 31 between the non-edge readout amplifier module and the adjacent memory array tile; and (8) the second internal offset cancellation signal OcEnaInter is configured to control the second offset cancellation switch 33 between the non-edge readout amplifier module and the adjacent memory array tile.

In this way, the bit lines in the memory array tile are classified into two types. In a bit line stress test process, two continuously numbered first bit line BLa and second bit line BLb in the non-edge memory array tile are respectively charged through the first precharge power supply VAD2O and the second precharge power supply VAD2E, and two first bit lines BLa whose serial numbers are adjacent (and second bit lines BLb respectively and electrically connected thereto) in the edge memory array tile are respectively charged through the first edge test power supply VAD2Eedge and the second edge test power supply VAS2Oedge, so that adjacent bit lines in the entire memory array tile can be in different voltage states, thereby efficiently completing the bit line stress test, reducing energy consumption, and further avoiding a problem that the bit lines are overcharged and excessively stressed.

Figure 8:
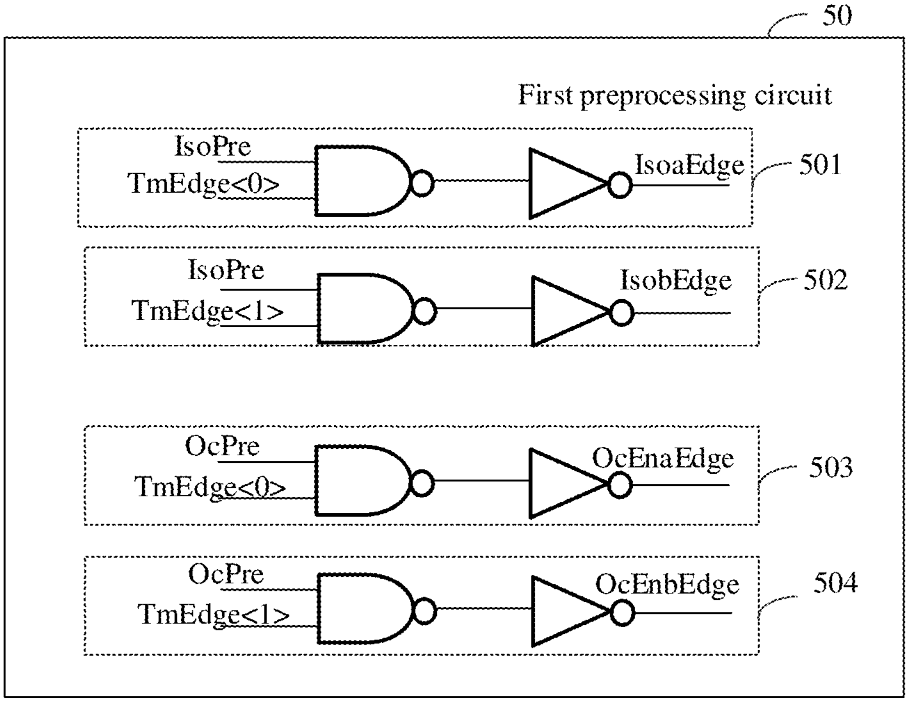
FIG. 8 is a schematic diagram 1 of a control part of a memory according to an embodiment of the present disclosure.
Figure 8:
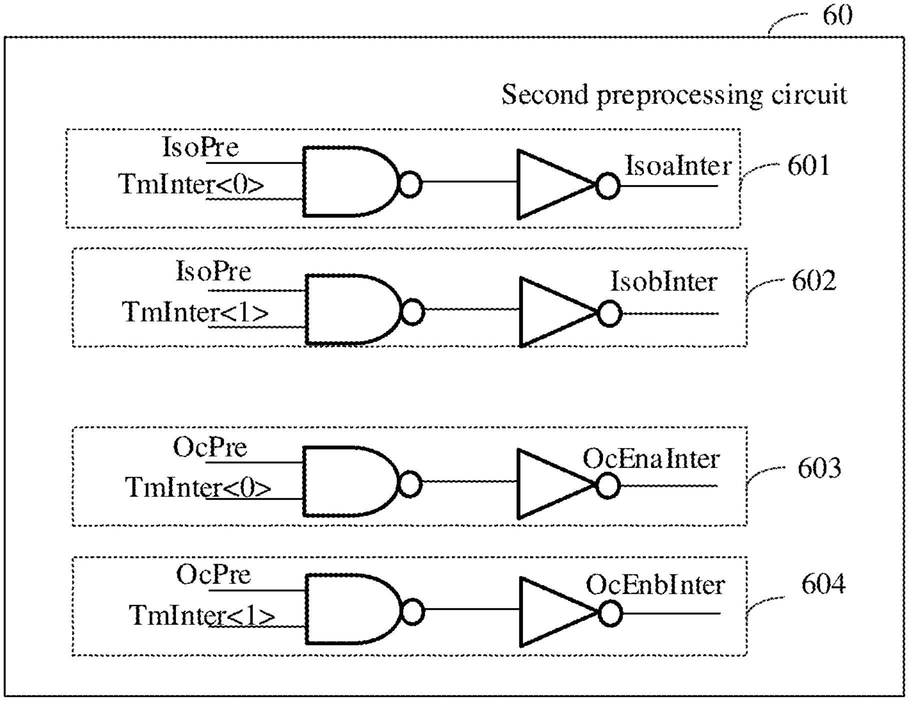

In a specific embodiment, as shown in FIG. 8, the edge test parameter group includes at least a first test parameter TmEdge<0> and a second test parameter TmEdge<1>, and the internal test parameter group includes at least a third test parameter TmInter<0> and a fourth test parameter TmInter<1>.

The first edge isolation signal IsobEdge and the first edge offset cancellation signal OcEnbEdge have the same levels as the initial isolation signal IsoPre and the initial offset cancellation signal OcPre in a one-to-one correspondence if the second test parameter TmEdge<1> is in a first state, or both the first edge isolation signal IsobEdge and the first edge offset cancellation signal OcEnbEdge are invalid if the second test parameter TmEdge<1> is in a second state.

The second edge isolation signal IsoaEdge and the second edge offset cancellation signal OcEnaEdge have the same levels as the initial isolation signal IsoPre and the initial offset cancellation signal OcPre in a one-to-one-correspondence if the first test parameter TmEdge<0> is in a first state, or both the second edge isolation signal IsoaEdge and the second edge offset cancellation signal OcEnaEdge are invalid if the first test parameter TmEdge<0> is in a second state.

The first internal isolation signal IsobInter and the first internal offset cancellation signal OcEnbInter have the same levels as the initial isolation signal IsoPre and the initial offset cancellation signal OcPre in a one-to-one correspondence if the fourth test parameter TmInter<1> is in a first state, or both the first internal isolation signal IsobInter and the first internal offset cancellation signal OcEnbInter are invalid if the fourth test parameter TmInter<1> is in a second state.

The second internal isolation signal IsoaInter and the second internal offset cancellation signal OcEnaInter have the same levels as the initial isolation signal IsoPre and the initial offset cancellation signal OcPre in a one-to-one correspondence if the third test parameter TmInter<0> is in a first state, or both the second internal isolation signal IsoaInter and the second internal offset cancellation signal OcEnaInter are invalid if the third test parameter TmInter<0> is in a second state.

In a process in which the memory is indicated to perform the bit line stress test operation, the second test parameter TmEdge<1> is in a second state, and the first test parameter TmEdge<0>, the third test parameter TmInter<0>, and the fourth test parameter TmInter<1> are each in a first state.

It should be noted that, corresponding switches are in an off state when the foregoing isolation signals, offset cancellation signals, and precharge signals are invalid, and corresponding switches are in an on state when the foregoing isolation signals, offset cancellation signals, and precharge signals are valid.

A specific operation scenario is provided: The first isolation switch 32, the second isolation switch 34, the first offset cancellation switch 31, and the second offset cancellation switch 33 are all N-type field effect transistors. "Valid" indicates a high level state, and "invalid" indicates a low level state.

Therefore, in a process of the bit line stress test operation, TmEdge<1:0>=01 and TmInter<1:0>=11. Therefore, the first edge isolation signal IsobEdge=the first edge offset cancellation signal OcEnbEdge=0, and the second edge isolation signal IsoaEdge=the second edge offset cancellation signal OcEnaEdge=1, so that the readout amplifier module 12_1 is electrically isolated from the memory array tile 11_1, and the readout amplifier module 12_64 is electrically isolated from the memory array tile 11_65, that is, the bit lines in the edge memory array tiles are electrically isolated from corresponding precharge power supplies. However, the readout amplifier module 12_1 is electrically communicated with the memory array tile 11_2, the readout amplifier module 12_64 is electrically communicated with the memory array tile 11_64, and the middle readout amplifier module 12_2 to readout amplifier module 12_63 are separately electrically communicated with memory array tiles on two sides, so that the bit lines in the non-edge memory array tiles are electrically communicated with corresponding precharge power supplies.

In the foregoing scenario, refer to FIG. 8. The first preprocessing circuit 50 includes:

- a first AND gate 501, two input terminals thereof respectively receiving the first test parameter TmEdge<0> and the initial isolation signal IsoPre, and an output terminal thereof outputting the second edge isolation signal IsoaEdge;
- a second AND gate 502, two input terminals thereof respectively receiving the second test parameter TmEdge<1> and the initial isolation signal IsoPre, and an output terminal thereof outputting the first edge isolation signal IsobEdge;
- a third AND gate 503, two input terminals thereof respectively receiving the first test parameter TmEdge<0> and the initial offset cancellation signal OcPre, and an output terminal thereof outputting the second edge offset cancellation signal OcEnaEdge; and a fourth AND gate 504, two input terminals thereof respectively receiving the second test parameter TmEdge<1> and the initial offset cancellation signal OcPre, and an output terminal thereof outputting the first edge offset cancellation signal OcEnbEdge.

The second preprocessing circuit 60 includes:

a fifth AND gate 601, two input terminals thereof respectively receiving the third test parameter TmInter<0> and the initial isolation signal IsoPre, and an output terminal thereof outputting the second internal isolation signal IsoaInter;

a sixth AND gate 602, two input terminals thereof respectively receiving the fourth test parameter TmInter<1> and the initial isolation signal IsoPre, and an output terminal thereof outputting the first internal isolation signal IsobInter;

a seventh AND gate 603, two input terminals thereof respectively receiving the third test parameter TmInter<0> and the initial offset cancellation signal OcPre, and an output terminal thereof outputting the second internal offset cancellation signal OcEnaInter; and an eighth AND gate 604, two input terminals thereof respectively receiving the fourth test parameter TmInter<1> and the initial offset cancellation signal OcPre, and an output terminal thereof outputting the first internal offset cancellation signal OcEnbInter.

In another specific embodiment, refer to FIG. 6 and FIG. 7. The readout amplifier module 12_1 is connected to the memory array tile 11_1 through the first offset cancellation switch 31 and the first isolation switch 32, but the readout amplifier module 12_64 is connected to the memory array tile 11_65 through the second offset cancellation switch 33 and the second isolation switch 34.

Figure 9:
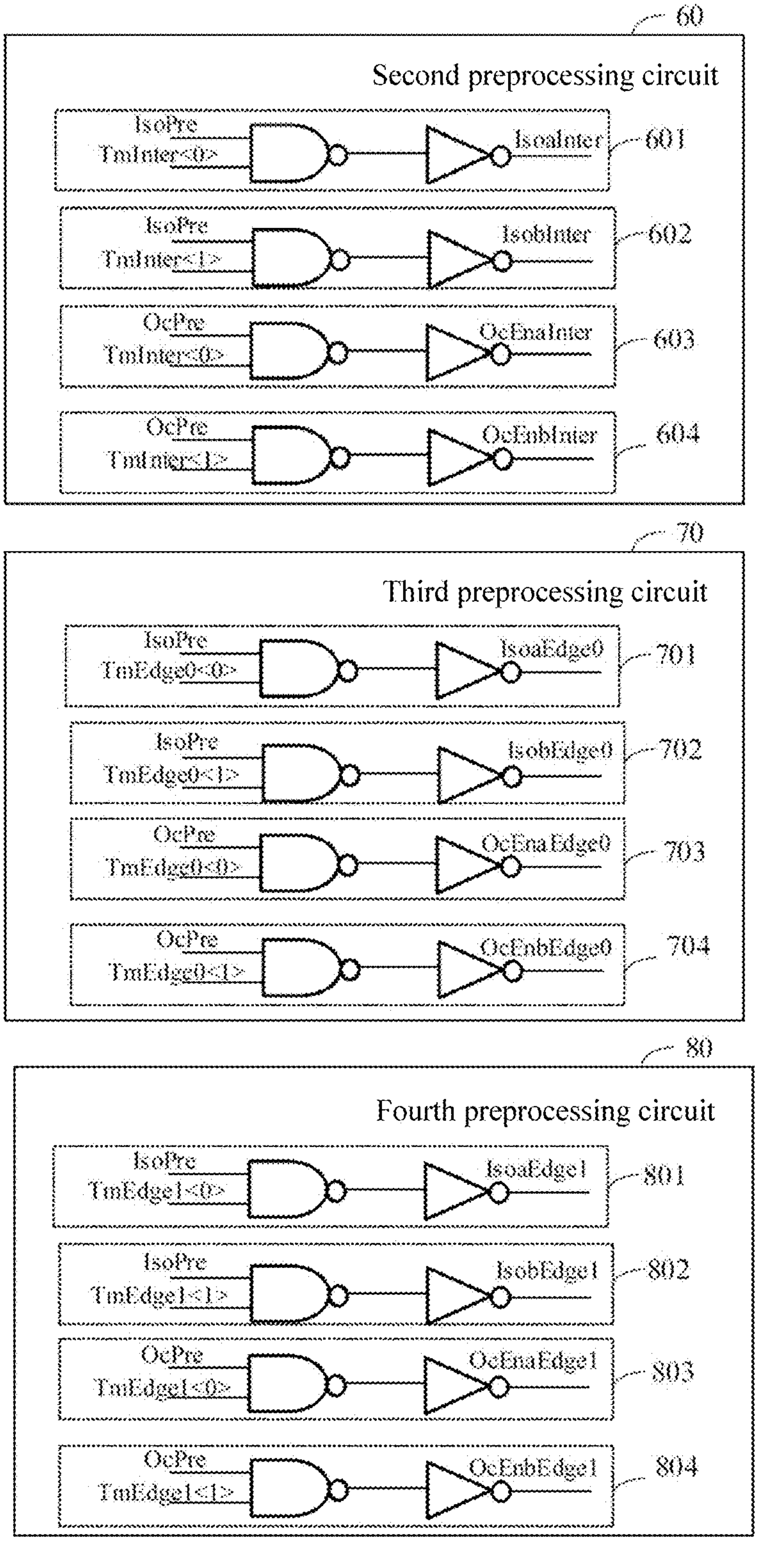
FIG. 9 is a schematic diagram 2 of a control part of a memory according to an embodiment of the present disclosure.

That is, the bit line in the first memory array tile 11_1 is electrically connected to an adjacent sense amplifier through the first offset cancellation switch or the first isolation switch, and the bit line 11_65 in the last memory array tile is electrically connected to an edge sense amplifier through the second offset cancellation switch or the second isolation switch. Refer to FIG. 9. The memory 10 further includes a command control circuit, a second preprocessing circuit 50, a third preprocessing circuit 70, and a fourth preprocessing circuit 80.

The command control circuit (not shown in FIG. 9) is configured to generate a test enable signal, an initial isolation signal IsoPre, and an initial offset cancellation signal OcPre. The test enable signal, the initial isolation signal IsoPre, and the initial offset cancellation signal OcPre are all in a valid state when the memory is indicated to perform the bit line stress test operation.

The second preprocessing circuit 60 is configured to generate a first internal isolation signal IsobInter and a second internal isolation signal IsoaInter based on an internal test parameter group TmInter<1:0> and the initial isolation signal IsoPre, and generate a first internal offset cancellation signal OcEnbInter and a second internal offset cancellation signal OcEnaInter based on the internal test parameter group and the initial offset cancellation signal OcPre.

The third preprocessing circuit 70 is configured to generate a first head terminal isolation signal IsobEdge0 and a second head terminal isolation signal IsoaEdge0 based on a head terminal test parameter group TmEdge0<1:0> and the initial isolation signal IsoPre, and generate a first head terminal offset cancellation signal OcEnbEdge0 and a second head terminal offset cancellation signal OcEnaEdge0 based on the head terminal test parameter group and the initial offset cancellation signal OcPre.

The fourth preprocessing circuit 80 is configured to generate a first tail terminal isolation signal IsobEdge1 and a second tail terminal isolation signal IsoaEdge1 based on a tail terminal test parameter group TmEdge1<1:0> and the initial isolation signal IsoPre, and generate a first tail terminal offset cancellation signal OcEnbEdge1 and a second tail terminal offset cancellation signal OcEnaEdge1 based on the tail terminal test parameter group and the initial offset cancellation signal OcPre.

All test switches 13 are controlled by the test enable signal. The first isolation switch, the second isolation switch, the first offset cancellation switch, and the second offset cancellation switch between a first readout amplifier module 11_1 and an adjacent memory array tile are controlled by the first head terminal isolation signal IsobEdge0, the second head terminal isolation signal IsoaEdge0, the first head terminal offset cancellation signal OcEnbEdge0, and the second head terminal offset cancellation signal OcEnaEdge0 in a one-to-one correspondence. The first isolation switch 31, the second isolation switch 33, the first offset cancellation switch 32, and the second offset cancellation switch 34 between a last readout amplifier module 11_65 and an adjacent memory array tile are controlled by the first tail terminal isolation signal IsobEdge1, the second tail terminal isolation signal IsoaEdge1, the first tail terminal offset cancellation signal OcEnbEdge1, and the second tail terminal offset cancellation signal in a one-to-one correspondence. The first isolation switch 31, the second isolation switch 33, the first offset cancellation switch 32, and the second offset cancellation switch 34 between a non-edge readout amplifier module (11_2, 11_3, . . . , 11_64) and an adjacent memory array tile are controlled by the first internal isolation signal IsobInter, the second internal isolation signal IsoaInter, the first internal offset cancellation signal OcEnbInter, and the second internal offset cancellation signal OcEnaInter in a one-to-one correspondence.

In some embodiments, the internal test parameter group includes at least a third test parameter TmInter<0> and a fourth test parameter TmInter<1>. The head terminal test parameter group includes a fifth test parameter TmEdge0<0> and a sixth test parameter TmEdge0<1>. The tail terminal test parameter group includes a seventh test parameter TmEdge1<0> and an eighth test parameter TmEdge1<1>.

The second internal isolation signal IsoaInter and the second internal offset cancellation signal OcEnaInter have the same levels as the initial isolation signal IsoPre and the initial offset cancellation signal OcPre in a one-to-one correspondence if the third test parameter TmInter<0> is in a first state, or both the second internal isolation signal IsoaInter and the second internal offset cancellation signal OcEnaInter are invalid if the third test parameter TmInter<0> is in a second state.

The first internal isolation signal IsobInter and the first internal offset cancellation signal OcEnbInter have the same levels as the initial isolation signal IsoPre and the initial offset cancellation signal OcPre in a one-to-one correspondence if the fourth test parameter TmInter<1> is in a first state, or both the first internal isolation signal IsobInter and the first internal offset cancellation signal OcEnbInter are invalid if the fourth test parameter TmInter<1> is in a second state.

The second head terminal isolation signal IsoaEdge0 and the second head terminal offset cancellation signal OcEnaEdge0 have the same levels as the initial isolation signal IsoPre and the initial offset cancellation signal OcPre in a one-to-one correspondence if the fifth test parameter TmEdge0<0> is in a first state, or both the second head terminal isolation signal IsoaEdge0 and the second head terminal offset cancellation signal OcEnaEdge0 are invalid if the fifth test parameter TmEdge0<0> is in a second state.

The first head terminal isolation signal IsobEdge0 and the first head terminal offset cancellation signal OcEnbEdge0 have the same levels as the initial isolation signal IsoPre and the initial offset cancellation signal OcPre in a one-to-one correspondence if the sixth test parameter TmEdge0<1> is in a first state, or both the first head terminal isolation signal IsobEdge0 and the first head terminal offset cancellation signal OcEnbEdge0 are invalid if the sixth test parameter TmEdge0<1> is in a second state.

The second tail terminal isolation signal IsoaEdge1 and the second tail terminal offset cancellation signal OcEnaEdge1 have the same levels as the initial isolation signal IsoPre and the initial offset cancellation signal OcPre in a one-to-one correspondence if the seventh test parameter TmEdge1<0> is in a first state, or both the second tail terminal isolation signal IsoaEdge1 and the second tail terminal offset cancellation signal OcEnaEdge1 are invalid if the seventh test parameter TmEdge1<0> is in a second state.

The first tail terminal isolation signal IsobEdge1 and the first tail terminal offset cancellation signal OcEnbEdge1 have the same levels as the initial isolation signal IsoPre and the initial offset cancellation signal OcPre in a one-to-one correspondence if the eighth test parameter TmEdge1<1> is in a first state, or both the first tail terminal isolation signal IsobEdge1 and the first tail terminal offset cancellation signal OcEnbEdge1 are invalid if the eighth test parameter TmEdge1<1> is in a second state.

In the process in which the memory is indicated to perform the bit line stress test operation, the sixth test parameter TmEdge0<1> and the seventh test parameter TmEdge1<0> are each in a second state, and the third test parameter TmInter<0>, the fourth test parameter TmInter<1>, the fifth test parameter TmEdge0<0>, and the eighth test parameter TmEdge1<1> are each in a first state.

Specifically, in the process of performing the bit line stress test operation, TmEdge0<1:0>=01, TmInter<1:0>=11, and TmEdge1<1:0>=10. Therefore, the readout amplifier module 12_1 is electrically isolated from the memory array tile 11_1, and the readout amplifier module 12_64 is electrically isolated from the memory array tile 11_65. However, the readout amplifier module 12_1 is electrically communicated with the memory array tile 11_2, and the readout amplifier module 12_64 is electrically communicated with the memory array tile 11_64. The readout amplifier module 12_2 to the readout amplifier module 12_63 are separately electrically communicated with memory array tiles on two sides. Therefore, the bit line in the non-edge memory array tile is precharged through the precharge power supply, but the bit line in the edge memory array tile cannot be precharged through the precharge power supply, but charged through the edge test power supply.

In the foregoing scenario, a structure of the second preprocessing circuit 60 in this case is the same as that shown in FIG. 8. Details are not described herein again.

Refer to FIG. 9. The third preprocessing circuit 70 includes:

a ninth AND gate 701, two input terminals thereof respectively receiving the fifth test parameter TmEdge0<0> and the initial isolation signal IsoPre, and an output terminal thereof outputting the second head terminal isolation signal IsoaEdge0;

a tenth AND gate 702, two input terminals thereof respectively receiving the sixth test parameter TmEdge0<1> and the initial isolation signal IsoPre, and an output terminal thereof outputting the first head terminal isolation signal IsobEdge0;

an eleventh AND gate 703, two input terminals thereof respectively receiving the fifth test parameter TmEdge0<0> and the initial offset cancellation signal OcPre, and an output terminal thereof outputting the second head terminal offset cancellation signal OcEnaEdge0; and a twelfth AND gate 704, two input terminals thereof respectively receiving the sixth test parameter TmEdge0<1> and the initial offset cancellation signal OcPre, and an output terminal thereof outputting the first head terminal offset cancellation signal OcEnbEdge0.

In this scenario, refer to FIG. 8. The fourth preprocessing circuit 80 includes:

a thirteenth AND gate 801, two input terminals thereof respectively receiving the seventh test parameter TmEdge1<0> and the initial isolation signal IsoPre, and an output terminal thereof outputting the second tail terminal isolation signal IsoaEdge1;

a fourteenth AND gate 802, two input terminals thereof respectively receiving the eighth test parameter TmEdge1<1> and the initial isolation signal IsoPre, and an output terminal thereof outputting the first tail terminal isolation signal IsobEdge1;

a fifteenth AND gate 803, two input terminals thereof respectively receiving the seventh test parameter TmEdge1<0> and the initial offset cancellation signal OcPre, and an output terminal thereof outputting the second tail terminal offset cancellation signal OcEnaEdge1; and a sixteenth AND gate 804, two input terminals thereof respectively receiving the eighth test parameter TmEdge1<1> and the initial offset cancellation signal OcPre, and an output terminal thereof outputting the first tail terminal offset cancellation signal OcEnbEdge1.

In conclusion, in the memory provided in this embodiment of the present disclosure, the area of the edge memory array tile is reduced to half of the area of another memory array tile. In addition, the precharge power supplies are classified into two groups for management, and an independent edge test power supply is additionally disposed for the bit line in the edge memory array tile, thereby efficiently implementing the bit line stress test, improving a test procedure of the memory of this structure, and ensuring as-shipped performance.

In a second specific embodiment, the bit line in the non-edge memory array tile (11_2, 11_3, . . . , 11_64) is further coupled to a respective precharge power supply through a column gating switch and a second test switch; and the first bit line in the edge memory array tile (11_1 and 11_65) is further coupled to a respective precharge power supply through a column gating switch and a second test switch. That is, the first bit line is electrically communicated with the respective precharge power supply only when both the column gating switch and the second test switch are turned on. The precharge power supply coupled to each bit line in each memory array tile is adopted as the stress test power supply.

The following provides specific description.

Figure 10:
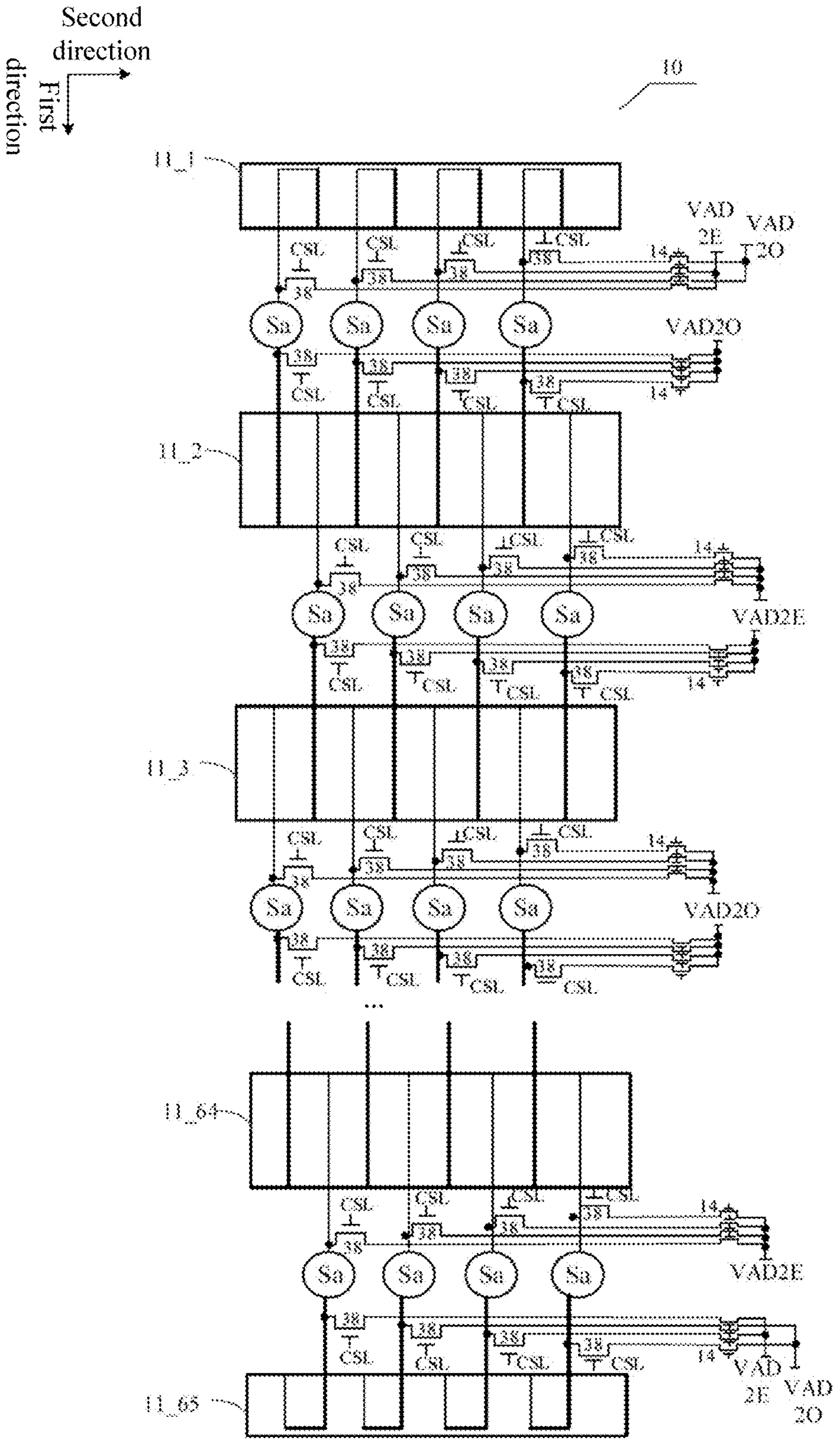
FIG. 10 is a schematic diagram 6 of a local structure of a memory according to an embodiment of the present disclosure.

Refer to FIG. 10. The memory 10 includes two groups of precharge power supplies, that is, first precharge power supplies VAD2O and second precharge power supplies VAD2E.

In addition, in a possible implementation, each bit line in all the memory array tiles is coupled to the first precharge power supply VAD2O through a respective precharge switch 35. However, one type of bit line is connected to the first precharge power supply VAD2O through the column gating switch+the second test switch, and the other type of bit line is connected to the second precharge power supply VAD2E through the column gating switch+the second test switch. In this way, in a stress test process, the precharge switch 35 is turned off and the column gating switch+the second test switch are turned on, so that one of two adjacent bit lines (in an internal array tile) (or two continuously numbered first bit lines in an edge array tile) is precharged through the first precharge power supply VAD2O and the other is precharged through the second precharge power supply VAD2E. In a normal operation process, the precharge switch 35 is turned on, and the second test switch is turned off, so that all the bit lines are precharged through the first precharge power supplies VAD2O, thereby implementing a normal precharge function.

Similarly, in another possible implementation, each bit line in all the memory array tiles is coupled to the second precharge power supply VAD2E through a respective pre-charge switch 35. Alternatively, in still another possible implementation, some bit lines are coupled to the first precharge power supplies VAD2O through respective pre-charge switches 35, and the remaining bit lines are coupled to the second precharge power supplies VAD2E through respective precharge switches 35, for example, the case described in the foregoing embodiment.

Refer to FIG. 6 and FIG. 10. In addition to being coupled to a corresponding precharge power supply through the precharge switch 35, each bit line is further coupled to the precharge power supply through the column gating switch 38+the second test switch 14. In addition, in the stress test process, the precharge switch 35 is turned off, but the column gating switch 38+the second test switch 14 are turned on, so that the first precharge power supply VAD2O and the second precharge power supply VAD2E can be respectively adopted as the stress test power supplies TXo and TXe in this case.

Specifically, the bit line in the non-edge memory array tile (11_2, 11_3, . . . , 11_64) is coupled to a respective local data line (IO/ION) through a respective column gating switch 38. (1) Local data lines coupled to the second bit line BLb in a non-edge odd-numbered memory array tile (11_3, 11_5, . . . , 11_63) and the first bit line BLa in a non-edge even-numbered memory array tile (11_2, 11_4, . . . , 11_64) are further connected to a first precharge power supply VAD2O through respective second test switches 14. (2) Local data lines coupled to the first bit line BLa in the non-edge odd-numbered memory array tile (11_3, 11_5, . . . , 11_63) and the second bit line BLb in the non-edge even-numbered memory array tile (11_2, 11_4, . . . , 11_64) are further connected to a second precharge power supply VAD2E through respective second test switches 14.

In addition, the first bit line in the edge memory array tile (11_1 and 11_65) is coupled to a respective local data line through a respective column gating switch.

In one case, refer to FIG. 10. (1) For the edge memory array tile (11_1 and 11_65), a local data line coupled to the odd-numbered first bit line BLao is coupled to a second precharge power supply VAD2E through the second test switch 14, and a local data line coupled to the even-numbered first bit line BLae is coupled to a first precharge power supply VAD2O through the second test switch 14.

In another case, for a first memory array tile 11_1, a local data line coupled to the odd-numbered first bit line BLao is coupled to a second precharge power supply VAD2E through the second test switch 14, and a local data line coupled to the even-numbered first bit line BLae is coupled to a first precharge power supply VAD2O through the second test switch 14, and for a last memory array tile 11_65, a local data line coupled to the odd-numbered first bit line BLao is coupled to a first precharge power supply VAD2O through the second test switch 14, and a local data line coupled to the even-numbered first bit line BLae is coupled to a second precharge power supply VAD2E through the second test switch 14.

Briefly, for the edge memory array tile, a precharge power supply connected to the first bit line through the precharge switch 35 may be different from a precharge power supply connected to the first bit line through the column gating switch 38+the second test switch 14. It is assumed in one case that all the first bit lines BLa in the memory array tile 11_1 are connected to the first precharge power supply VAD2O through the precharge switches 35, but BLao in the memory array tile 11_1 is coupled to the second precharge power supply VAD2E through the column gating switch 38+the second test switch 14, and BLae is coupled to the first precharge power supply VAD2O through the column gating switch 38+the second test switch 14. This is merely a possible case. In addition, in the bit line stress test process, all the bit lines are communicated with corresponding pre-charge power supplies through the column gating switches 38+the second test switches 14, but the precharge switches are turned off. In a conventional precharge operation, all the bit lines are communicated with the corresponding pre-charge power supplies through the precharge switches, but the column gating switches 38+the second test switches 14 are turned off.

Based on the structure in FIG. 10, a process in which the memory 10 performs BL stress on the non-edge memory array tile is as follows:

The memory 10 is configured to control all isolation switches, offset cancellation switches, and precharge switches to be in an off state, control all column gating switches and second test switches to be in an on state, and control the first precharge power supply to be at a first voltage value and the second precharge power supply to be at a second voltage value, to perform one time of bit line stress test.

In this way, in the bit line stress test process, all the bit lines are communicated with the corresponding precharge power supplies through the column gating switches 38+the second test switches 14. It is assumed that the first voltage value=the third voltage value=a high level (for example, 1.55 V), and the second voltage value=the fourth voltage value=a low level (for example, 0 V). Refer to FIG. 10. To be specific:

(1) In a non-edge odd-numbered memory array tile (for example, the memory array tile 11_3, 11_5, . . . , or 11_63), the first bit lines BLa are all at a low level (precharged through VAD2E), and the second bit lines BLb are all at a high level (precharged through VAD2O).

(2) In a non-edge even-numbered memory array tile (for example, the memory array tile 11_2, 11_4, . . . , or 11_64), the first bit lines BLa are all at a high level (precharged through VAD2O), and the second bit lines BLb are all at a low level (precharged through VAD2E).

(3) For the memory array tiles 11_1 and 11_65, both the odd-numbered first bit line BLao and the second bit line BLbo electrically connected thereto are at a low level (precharged through VAD2E), and both the even-numbered first bit line BLa and the second bit line BLb electrically connected thereto are at a high level (precharged through VAD2O).

In addition, the memory 10 is further configured to control all isolation switches, offset cancellation switches, and precharge switches to be in an off state, control all column gating switches and second test switches to be in an on state, and control the first precharge power supply to be at a second voltage value and the second precharge power supply to be at a first voltage value, to perform another time of bit line stress test.

It is assumed that the first voltage value=the third voltage value=a high level, and the second voltage value=the fourth voltage value=a low level. Refer to FIG. 10. To be specific:

(4) In the non-edge odd-numbered memory array tile (for example, the memory array tile 11_3, 11_5, . . . , or 11_63), the first bit lines BLa are all at a high level (precharged through VAD2E), and the second bit lines BLb are all at a low level (precharged through VAD2O).

(5) In the non-edge even-numbered memory array tile (for example, the memory array tile 11_2, 11_4, . . . , or 11_64), the first bit lines BLa are all at a low level (precharged through VAD2O), and the second bit lines BLb are all at a high level (precharged through VAD2E).

(6) For the memory array tiles 11_1 and 11_65, both the odd-numbered first bit line BLao and the second bit line BLbo electrically connected thereto are at a high level (precharged through VAD2E), and both the even-numbered first bit line BLa and the second bit line BLb electrically connected thereto are at a low level (precharged through VAD2O).

In the memory provided in this embodiment of the present disclosure, each bit line is further connected to the precharge power supply through the column gating switch and the second test switch, so that the precharge power supply is adopted as the stress test power supply. On the one hand, the bit line stress test can be efficiently implemented, the test procedure of the memory of this structure can be improved, and as-shipped performance can be ensured. On the other hand, there is no need to dispose two groups of independent edge test power supplies for the edge memory array tiles, and a circuit area is reduced.

In a third specific embodiment, the bit line in the non-edge memory array tile (11_2, 11_3, . . . , 11_64) is further coupled to a respective preset test power supply through a column gating switch 38 and a second test switch 14; the first bit line in the edge memory array tile (11_1 and 11_65) is further coupled to a respective preset test power supply through a column gating switch and a second test switch; and the preset test power supply coupled to each bit line in each memory array tile is adopted as the stress test power supply.

That is, in addition to the precharge power supplies, two groups of preset test power supplies are further disposed in the memory 10, that is, first preset test power supplies Vintlp2*o* and second preset test power supplies Vintlp2*o*, which are respectively adopted as the stress test power supplies TXo and TXe.

The following provides specific description.

Figure 11:
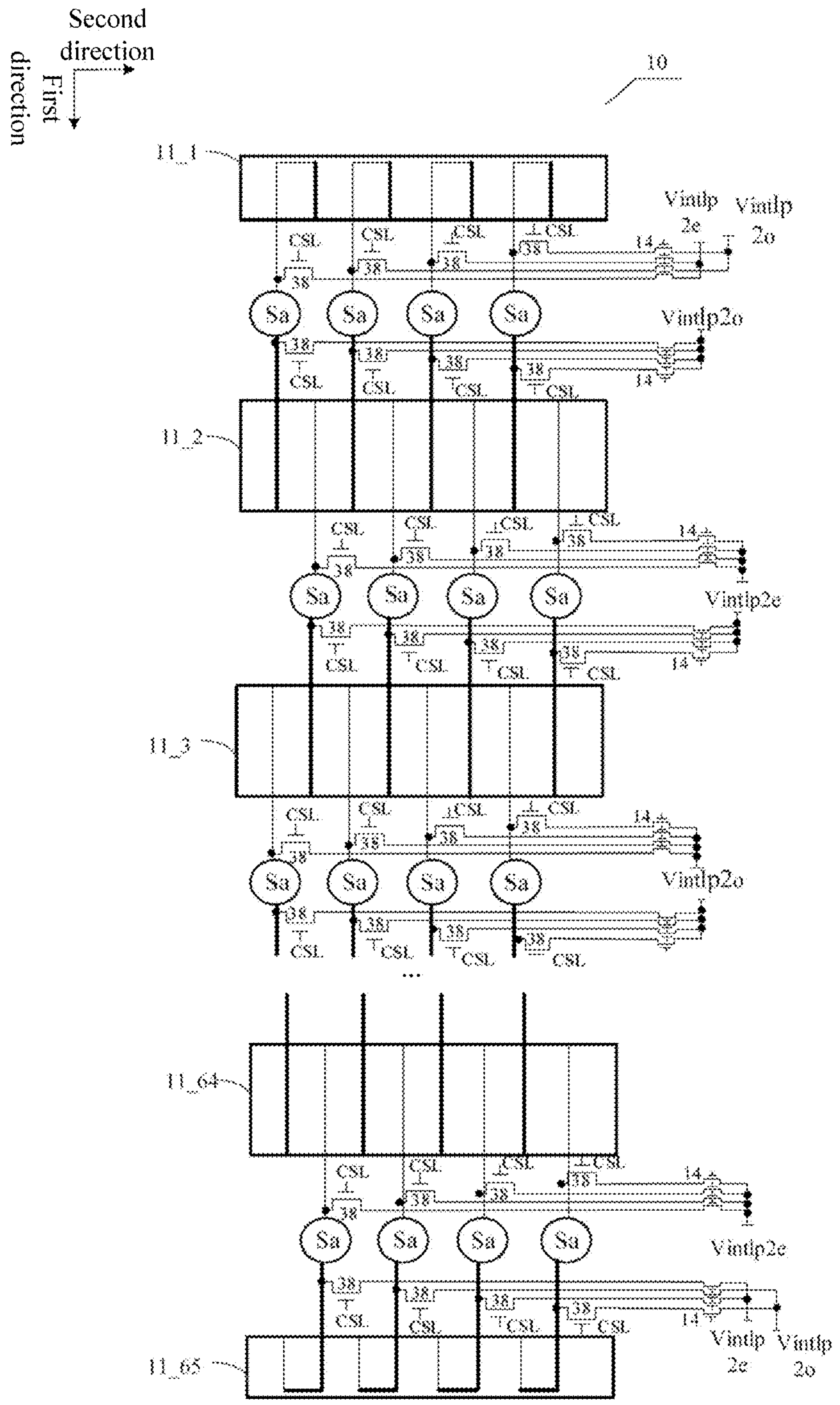
FIG. 11 is a schematic diagram 7 of a local structure of a memory according to an embodiment of the present disclosure.

Refer to FIG. 6 and FIG. 11. Each bit line in the non-edge memory array tile (11_2, 11_3, . . . , 11_64) is coupled to a respective local data line (IO/ION) through a respective column gating switch 38. (1) Local data lines coupled to the second bit line BLb in a non-edge odd-numbered memory array tile (11_3, 11_5, . . . , 11_63) and the first bit line BLa in a non-edge even-numbered memory array tile (11_2, 11_4, . . . , 11_64) are coupled to a first preset test power supply Vintlp2*o* through the second test switches 14. (2) Local data lines coupled to the first bit line BLa in the non-edge odd-numbered memory array tile (11_3, 11_5, . . . , 11_63) and the second bit line BLb in the non-edge even-numbered memory array tile (11_2, 11_4, . . . , 11_64) are coupled to a second preset test power supply Vintlp2*e* through the second test switches 14.

In addition, the first bit line in the edge memory array tile (11_1 and 11_65) is coupled to a respective local data line through a respective column gating switch.

In one case, refer to FIG. 11. (1) For the edge memory array tile (11_1 and 11_65), a local data line coupled to the odd-numbered first bit line BLao is coupled to a second preset test power supply Vintlp2*e* through the second test switch 14, and a local data line coupled to the even-numbered first bit line BLae is coupled to a first preset test power supply Vintlp2*o* through the second test switch 14.

In another case, for a first memory array tile 11_1, a local data line coupled to the odd-numbered first bit line BLao is coupled to a second preset test power supply Vintlp2*e* through the second test switch 14, and a local data line coupled to the even-numbered first bit line BLae is coupled to a first preset test power supply Vintlp2*o* through the second test switch 14, and for a last memory array tile 11_65, a local data line coupled to the odd-numbered first bit line BLao is coupled to a first preset test power supply Vintlp2*o* through the second test switch 14, and a local data line coupled to the even-numbered first bit line BLae is coupled to a second preset test power supply Vintlp2*e* through the second test switch 14.

For example, the first preset test power supply may use a precharge power supply of the local data line IO, and the second preset test power supply may use a precharge power supply of the local data line ION, and no additional independent power supply is required, thereby reducing the circuit area.

Based on the structure in FIG. 11, a process in which the memory 10 performs BL stress on the non-edge memory array tile is as follows:

The memory 10 is configured to control all isolation switches and offset cancellation switches to be in an off state, control all precharge switches to be in an on state, and control the precharge power supply VAD to be at a fifth voltage value; and control all column gating switches and second test switches to be in an on state, and control the first preset test power supply to be at a first voltage value and the second preset test power supply to be at a second voltage value, to perform one time of bit line stress test.

It should be noted that a voltage of the fifth voltage value is located between a voltage of the first voltage value and a voltage of the second voltage value. In this way, the first voltage value may be a high level (for example, 1.55 V), the second voltage value is a low level (for example, 0 V), and the fifth voltage value may be 0.5 V. Therefore, in the bit line stress test process, the pull-up unit NCS and the pull-down unit PCS are precharged through the precharge power supply VAD to 0.5 V through the precharge switch 38. In this way, the sense amplifier SA is not excessively stressed.

In the foregoing voltage conditions, as shown in FIG. 11.

(1) In a non-edge odd-numbered memory array tile (for example, the memory array tile 11_3, 11_5, . . . , or 11_63), the first bit lines BLa are all at a low level (precharged through Vintlp2*e*), and the second bit lines BLb are all at a high level (precharged through Vintlp2*o*).

(2) In a non-edge even-numbered memory array tile (for example, the memory array tile 11_2, 11_4, . . . , or 11_64), the first bit lines BLa are all at a high level (precharged through Vintlp2*o*), and the second bit lines BLb are all at a low level (precharged through Vintlp2*e*).

(3) For the memory array tiles 11_1 and 11_65, both the odd-numbered first bit line BLao and the second bit line BLbo electrically connected thereto are at a low level (precharged through Vintlp2*e*), and both the even-numbered first bit line BLae and the second bit line BLbe electrically connected thereto are at a high level (precharged through Vintlp2*o*).

In addition, the memory 10 is further configured to control all isolation switches and offset cancellation switches to be in an off state, control all precharge switches to be in an on state, and control the precharge power supply to be at a fifth voltage value; and control all column gating switches and second test switches to be in an on state, and control the first preset test power supply to be at a second voltage value and the second preset test power supply to be at a first voltage value, to perform another time of bit line stress test.

It is assumed that the first voltage value=the third voltage value=a high level, the second voltage value=the fourth voltage value=a low level, and the fifth voltage value=0.5 V. Refer to FIG. 11. To be specific:

(4) In the non-edge odd-numbered memory array tile (for example, the memory array tile 11_3, 11_5, . . . , or 11_63), the first bit lines BLa are all at a high level (precharged through Vintlp2*e*), and the second bit lines BLb are all at a low level (precharged through Vintlp2*o*).

(5) In the non-edge even-numbered memory array tile (for example, the memory array tile 11_2, 11_4, . . . , or 11_64), the first bit lines BLa are all at a low level (precharged through Vintlp2*o*), and the second bit lines BLb are all at a high level (precharged through Vintlp2*e*).

(6) For the memory array tiles 11_1 and 11_65, both the odd-numbered first bit line BLao and the second bit line BLbo electrically connected thereto are at a high level (precharged through Vintlp2*e*), and both the even-numbered first bit line BLa and the second bit line BLb electrically connected thereto are at a low level (pre-charged through Vintlp2*o*).

In short, in the bit line stress test process, all the bit lines are communicated with corresponding preset test power supplies through the column gating switches 38+the second test switches 14, and the precharge switches are turned on, so that the pull-up modules PCS and the pull-down modules NCS are approximately at 0.5 V, and the sense amplifiers SA are prevented from being excessively stressed. In a conventional precharge operation, all the bit lines are communicated with the corresponding precharge power supplies through the precharge switches, but the column gating switches 38+the second test switches 14 are turned off.

In the memory provided in this embodiment of the present disclosure, the area of the edge memory array tile is reduced to half of the area of another memory array tile, and two groups of preset test power supplies are further provided in addition to the precharge power supplies, thereby efficiently implementing the bit line stress test, improving the test procedure of the memory of this structure, and ensuring as-shipped performance.

In another embodiment of the present disclosure, a test method is provided. The test method is applied to the foregoing memory 10. The memory 10 includes N memory array tiles sequentially arranged in a first direction. The memory array tile includes multiple first bit lines and multiple second bit lines, and the first bit lines and the second bit lines are alternately arranged in a second direction. The first bit line is electrically isolated from an adjacent second bit line for a non-edge memory array tile, and the first bit line is electrically connected to an adjacent second bit line on a first side and the first bit line is electrically isolated from an adjacent second bit line on a second side for an edge memory array tile.

For ease of description, the memory array tiles are numbered in the first direction. A first one of bit lines in an odd-numbered memory array tile is a second bit line. A first one of bit lines in an even-numbered memory array tile is a first bit line. The first bit lines in each memory array tile are sequentially numbered in the second direction, and the second bit lines in each memory array tile are sequentially numbered in the second direction.

The method includes:

In the step S901, in a process of performing a bit line stress test operation, each first bit line in an edge memory array tile is charged through a stress test power supply corresponding to each first bit line; and each bit line in a non-edge memory array tile is charged through a stress test power supply corresponding to each bit line. The foregoing operations are simultaneously performed.

For the edge memory array tile, a voltage of a stress test power supply corresponding to an odd-numbered first bit line is different from that of a stress test power supply corresponding to an even-numbered first bit line. For a non-edge memory array tile, a voltage of a stress test power supply corresponding to the first bit line is different from that of a stress test power supply corresponding to an adjacent second bit line.

In conclusion, this embodiment of the present disclosure further provides a test method for the foregoing memory 10. Adjacent bit lines in all memory array tiles can be at different voltages by performing one step, thereby efficiently implementing the bit line stress test, improving a test procedure of the memory of this structure, and ensuring as-shipped performance.

It should be noted that in this specification, the terms "include", "comprise", or any other variant thereof are intended to cover non-exclusive inclusion, so that a process, method, article, or apparatus including a series of elements includes not only those elements but also other elements that are not expressly listed, or further includes elements inherent to such a process, method, article, or apparatus. An element preceded by "includes a . . . " does not, without more constraints, preclude the presence of additional identical elements in the process, method, article, or apparatus including the element.

The sequence numbers of the foregoing embodiments of the present disclosure are merely for the purpose of description, and are not intended to indicate priorities of the embodiments. The methods disclosed in the several method embodiments provided in the present disclosure may be randomly combined when there is no conflict, to obtain new method embodiments. The features disclosed in the several product embodiments provided in the present disclosure may be randomly combined when there is no conflict, to obtain new product embodiments. The features disclosed in the several method or device embodiments provided in the present disclosure may be randomly combined when there is no conflict, to obtain new method embodiments or new device embodiments.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A memory, comprising N memory array tiles sequentially arranged in a first direction, N being a natural number, each of the memory array tiles comprising a plurality of first bit lines and a plurality of second bit lines, the first bit lines and the second bit lines being alternately arranged in a second direction, the first bit line being electrically isolated from an adjacent second bit line for a non-edge memory array tile, the first bit line being electrically connected to an adjacent second bit line on a first side and the first bit line being electrically isolated from an adjacent second bit line on a second side for an edge memory array tile, and the first side and the second side being two opposite sides in the second direction;

the memory array tiles being numbered in the first direction, and in each of the memory array tiles, the first bit lines being numbered in the second direction and the second bit lines being numbered in the second direction;

each bit line in the non-edge memory array tile being coupled to a corresponding stress test power supply, and a stress test power supply corresponding to the first bit line being different from a stress test power supply corresponding to the adjacent second bit line; and the first bit line in the edge memory array tile being coupled to a corresponding stress test power supply, and a stress test power supply corresponding to an odd-numbered first bit line being different from a stress test power supply corresponding to an even-numbered first bit line.

2. The memory according to claim 1, wherein a first one of bit lines in the odd-numbered memory array tile is a second bit line, and a first one of bit lines in the even-numbered memory array tile is a first bit line;

readout amplifier modules are distributed between every two memory array tiles, each of the readout amplifier modules comprises a plurality of sense amplifiers sequentially arranged in the second direction, a first terminal of each of the sense amplifiers is connected to one of the second bit lines on a third side through a first offset cancellation switch, and a second terminal of the sense amplifier is connected to one of the second bit lines on the third side through a first isolation switch;

the second terminal of the sense amplifier is further connected to one of the first bit lines on a fourth side through a second offset cancellation switch, the first terminal of the sense amplifier is further connected to one of the first bit lines on the fourth side through a second isolation switch, and the third side and the fourth side are two opposite sides in the first direction; and the first terminal or the second terminal of each sense amplifier is further connected to a precharge power supply through a corresponding precharge switch, so that each bit line is coupled to a precharge power supply.

3. The memory according to claim 2, wherein the precharge power supply coupled to the bit line in the non-edge memory array tile is adopted as the stress test power supply; and the first bit line in the edge memory array tile is further coupled to a respective edge test power supply through a first test switch, and the edge test power supply coupled to the first bit line is adopted as the stress test power supply.

4. The memory according to claim 2, wherein the bit line in the non-edge memory array tile is further coupled to a respective precharge power supply through a column gating switch and a second test switch;

the first bit line in the edge memory array tile is further coupled to a respective precharge power supply through a column gating switch and a second test switch; and the precharge power supply coupled to each bit line in each memory array tile is adopted as the stress test power supply.

5. The memory according to claim 2, wherein the bit line in the non-edge memory array tile is further coupled to a respective preset test power supply through a column gating switch and a second test switch;

the first bit line in the edge memory array tile is further coupled to a respective preset test power supply through a column gating switch and a second test switch; and the preset test power supply coupled to each bit line in each memory array tile is adopted as the stress test power supply.

6. The memory according to claim 3, wherein the readout amplifier modules are numbered in the first direction; and the first terminal or the second terminal of the sense amplifier in an odd-numbered readout amplifier module is connected to a first precharge power supply through a corresponding precharge switch, and the first terminal or the second terminal of the sense amplifier in an even-numbered readout amplifier module is connected to a second precharge power supply through a corresponding precharge switch, so that the stress test power supply corresponding to the first bit line is different from the stress test power supply corresponding to the adjacent second bit line.

7. The memory according to claim 6, wherein for the edge memory array tile, the odd-numbered first bit line is connected to a first edge test power supply through a respective first test switch, and the even-numbered first bit line is connected to a second edge test power supply through a respective first test switch; or for a first memory array tile, the odd-numbered first bit line is connected to a first edge test power supply through a respective first test switch and the even-numbered first bit line is connected to a second edge test power supply through a respective first test switch, and for a last memory array tile, the odd-numbered first bit line is connected to a second edge test power supply through a respective first test switch and the even-numbered first bit line is connected to a first edge test power supply through a respective first test switch.

8. The memory according to claim 7, wherein the memory is configured to: control the first edge test power supply to be at a first voltage value, the second edge test power supply to be at a second voltage value, the first precharge power supply to be at a third voltage value, and the second precharge power supply to be at a fourth voltage value, and perform a bit line stress test operation; and control the first edge test power supply to be at the second voltage value, the second edge test power supply to be at the first voltage value, the first precharge power supply to be at the fourth voltage value, and the second precharge power supply to be at the third voltage value, and perform the bit line stress test operation;

wherein the first voltage value is different from the second voltage value, the third voltage value is different from the fourth voltage value, and in the bit line stress test operation, all first test switches are in an on state, isolation switches and offset cancellation switches between the edge memory array tile and an adjacent readout amplifier module are all in an off state, and other isolation switches, other offset cancellation switches, and all precharge switches are all in an on state.

9. The memory according to claim 8, wherein the bit line in the edge memory array tile is electrically connected to an adjacent sense amplifier through the first offset cancellation switch or the first isolation switch, and the memory further comprises:

a command control circuit, configured to generate a test enable signal, an initial isolation signal, and an initial offset cancellation signal, the test enable signal, the initial isolation signal, and the initial offset cancellation signal all being in a valid state when the memory is indicated to perform the bit line stress test operation;

a first preprocessing circuit, configured to generate a first edge isolation signal and a second edge isolation signal based on an edge test parameter group and the initial isolation signal, and generate a first edge offset cancellation signal and a second edge offset cancellation signal based on the edge test parameter group and the initial offset cancellation signal; and a second preprocessing circuit, configured to generate a first internal isolation signal and a second internal isolation signal based on an internal test parameter group and the initial isolation signal, and generate a first internal offset cancellation signal and a second internal offset cancellation signal based on the internal test parameter group and the initial offset cancellation signal; and all the first test switches are controlled by the test enable signal, the first isolation switch, the second isolation switch, the first offset cancellation switch, and the second offset cancellation switch between an edge readout amplifier module and an adjacent memory array tile are controlled by the first edge isolation signal, the second edge isolation signal, the first edge offset cancellation signal, and the second edge offset cancellation signal in a one-to-one correspondence, and the first isolation switch, the second isolation switch, the first offset cancellation switch, and the second offset cancellation switch between a non-edge readout amplifier module and an adjacent memory array tile are correspondingly controlled by the first internal isolation signal, the second internal isolation signal, the first internal offset cancellation signal, and the second internal offset cancellation signal.

10. The memory according to claim 9, wherein the edge test parameter group comprises a first test parameter and a second test parameter, and the internal test parameter group comprises a third test parameter and a fourth test parameter;

the second edge isolation signal and the second edge offset cancellation signal have the same levels as the initial isolation signal and the initial offset cancellation signal in a one-to-one correspondence if the first test parameter is in a first state, or both the second edge isolation signal and the second edge offset cancellation signal are invalid if the first test parameter is in a second state;

the first edge isolation signal and the first edge offset cancellation signal have the same levels as the initial isolation signal and the initial offset cancellation signal in a one-to-one correspondence if the second test parameter is in a first state, or both the first edge isolation signal and the first edge offset cancellation signal are invalid if the second test parameter is in a second state;

the first internal isolation signal and the first internal offset cancellation signal have the same levels as the initial isolation signal and the initial offset cancellation signal in a one-to-one correspondence if the fourth test parameter is in a first state, or both the first internal isolation signal and the first internal offset cancellation signal are invalid if the fourth test parameter is in a second state;

the second internal isolation signal and the second internal offset cancellation signal have the same levels as the initial isolation signal and the initial offset cancellation signal in a one-to-one correspondence if the third test parameter is in a first state, or both the second internal isolation signal and the second internal offset cancellation signal are invalid if the third test parameter is in a second state; and in a process in which the memory is indicated to perform the bit line stress test operation, the second test parameter is in a second state, and the first test parameter, the third test parameter, and the fourth test parameter are each in a first state.

11. The memory according to claim 10, wherein the first state is a high level, and the second state is a low level; and the first preprocessing circuit comprises:

a first AND gate, two input terminals thereof respectively receiving the first test parameter and the initial isolation signal, and an output terminal thereof outputting the second edge isolation signal;

a second AND gate, two input terminals thereof respectively receiving the second test parameter and the initial isolation signal, and an output terminal thereof outputting the first edge isolation signal;

a third AND gate, two input terminals thereof respectively receiving the first test parameter and the initial offset cancellation signal, and an output terminal thereof outputting the second edge offset cancellation signal; and a fourth AND gate, two input terminals thereof respectively receiving the second test parameter and the initial offset cancellation signal, and an output terminal thereof outputting the first edge offset cancellation signal.

12. The memory according to claim 8, wherein the bit line in the first memory array tile is electrically connected to an adjacent sense amplifier through the first offset cancellation switch or the first isolation switch, the bit line in the last memory array tile is electrically connected to an edge sense amplifier through the second offset cancellation switch or the second isolation switch, and the memory further comprises:

a command control circuit, configured to generate a test enable signal, an initial isolation signal, and an initial offset cancellation signal, the test enable signal, the initial isolation signal, and the initial offset cancellation signal all being in a valid state when the memory is indicated to perform the bit line stress test operation;

a second preprocessing circuit, configured to generate a first internal isolation signal and a second internal isolation signal based on an internal test parameter group and the initial isolation signal, and generate a first internal offset cancellation signal and a second internal offset cancellation signal based on the internal test parameter group and the initial offset cancellation signal;

a third preprocessing circuit, configured to generate a first head terminal isolation signal and a second head terminal isolation signal based on a head terminal test parameter group and the initial isolation signal, and generate a first head terminal offset cancellation signal and a second head terminal offset cancellation signal based on the head terminal test parameter group and the initial offset cancellation signal; and a fourth preprocessing circuit, configured to generate a first tail terminal isolation signal and a second tail terminal isolation signal based on a tail terminal test parameter group and the initial isolation signal, and generate a first tail terminal offset cancellation signal and a second tail terminal offset cancellation signal based on the tail terminal test parameter group and the initial offset cancellation signal; and all the first test switches are controlled by the test enable signal, the first isolation switch, the second isolation switch, the first offset cancellation switch, and the second offset cancellation switch between a first readout amplifier module and an adjacent memory array tile are controlled by the first head terminal isolation signal, the second head terminal isolation signal, the first head terminal offset cancellation signal, and the second head terminal offset cancellation signal in a one-to-one correspondence, the first isolation switch, the second isolation switch, the first offset cancellation switch, and the second offset cancellation switch between a last readout amplifier module and an adjacent memory array tile are controlled by the first tail terminal isolation signal, the second tail terminal isolation signal, the first tail terminal offset cancellation signal, and the second tail terminal offset cancellation signal in a one-to-one correspondence, and the first isolation switch, the second isolation switch, the first offset cancellation switch, and the second offset cancellation switch between a non-edge readout amplifier module and an adjacent memory array tile are controlled by the first internal isolation signal, the second internal isolation signal, the first internal offset cancellation signal, and the second internal offset cancellation signal in a one-to-one correspondence.

13. The memory according to claim 12, wherein the internal test parameter group comprises at least a third test parameter and a fourth test parameter, the head terminal test parameter group comprises a fifth test parameter and a sixth test parameter, and the tail terminal test parameter group comprises a seventh test parameter and an eighth test parameter;

the second internal isolation signal and the second internal offset cancellation signal have the same levels as the initial isolation signal and the initial offset cancellation signal in a one-to-one correspondence if the third test parameter is in a first state, or both the second internal isolation signal and the second internal offset cancellation signal are invalid if the third test parameter is in a second state;

the first internal isolation signal and the first internal offset cancellation signal have the same levels as the initial isolation signal and the initial offset cancellation signal in a one-to-one correspondence if the fourth test parameter is in a first state, or both the first internal isolation signal and the first internal offset cancellation signal are invalid if the fourth test parameter is in a second state;

the second head terminal isolation signal and the second head terminal offset cancellation signal have the same levels as the initial isolation signal and the initial offset cancellation signal in a one-to-one correspondence if the fifth test parameter is in a first state, or both the second head terminal isolation signal and the second head terminal offset cancellation signal are invalid if the fifth test parameter is in a second state;

the first head terminal isolation signal and the first head terminal offset cancellation signal have the same levels as the initial isolation signal and the initial offset cancellation signal in a one-to-one correspondence if the sixth test parameter is in a first state, or both the first head terminal isolation signal and the first head terminal offset cancellation signal are invalid if the sixth test parameter is in a second state;

the second tail terminal isolation signal and the second tail terminal offset cancellation signal have the same levels as the initial isolation signal and the initial offset cancellation signal in a one-to-one correspondence if the seventh test parameter is in a first state, or both the second tail terminal isolation signal and the second tail terminal offset cancellation signal are invalid if the seventh test parameter is in a second state;

the first tail terminal isolation signal and the first tail terminal offset cancellation signal have the same levels as the initial isolation signal and the initial offset cancellation signal in a one-to-one correspondence if the eighth test parameter is in a first state, or both the first tail terminal isolation signal and the first tail terminal offset cancellation signal are invalid if the eighth test parameter is in a second state; and in a process in which the memory is indicated to perform the bit line stress test operation, the sixth test parameter and the seventh test parameter are each in a second state, and the third test parameter, the fourth test parameter, the fifth test parameter, and the eighth test parameter are each in a first state.

14. The memory according to claim 10, wherein the first state is a high level, and the second state is a low level; and the second preprocessing circuit comprises:

a fifth AND gate, two input terminals thereof respectively receiving the third test parameter and the initial isolation signal, and an output terminal thereof outputting the second internal isolation signal;

a sixth AND gate, two input terminals thereof respectively receiving the fourth test parameter and the initial isolation signal, and an output terminal thereof outputting the first internal isolation signal;

a seventh AND gate, two input terminals thereof respectively receiving the third test parameter and the initial offset cancellation signal, and an output terminal thereof outputting the second internal offset cancellation signal; and an eighth AND gate, two input terminals thereof respectively receiving the fourth test parameter and the initial offset cancellation signal, and an output terminal thereof outputting the first internal offset cancellation signal.

15. The memory according to claim 13, wherein the first state is a high level, and the second state is a low level;

the third preprocessing circuit comprises:

a ninth AND gate, two input terminals thereof respectively receiving the fifth test parameter and the initial isolation signal, and an output terminal thereof outputting the second head terminal isolation signal;

a tenth AND gate, two input terminals thereof respectively receiving the sixth test parameter and the initial isolation signal, and an output terminal thereof outputting the first head terminal isolation signal;

an eleventh AND gate, two input terminals thereof respectively receiving the fifth test parameter and the initial offset cancellation signal, and an output terminal thereof outputting the second head terminal offset cancellation signal; and a twelfth AND gate, two input terminals thereof respectively receiving the sixth test parameter and the initial offset cancellation signal, and an output terminal thereof outputting the first head terminal offset cancellation signal; and the fourth preprocessing circuit comprises:

a thirteenth AND gate, two input terminals thereof respectively receiving the seventh test parameter and the initial isolation signal, and an output terminal thereof outputting the second tail terminal isolation signal;

a fourteenth AND gate, two input terminals thereof respectively receiving the eighth test parameter and the initial isolation signal, and an output terminal thereof outputting the first tail terminal isolation signal;

a fifteenth AND gate, two input terminals thereof respectively receiving the seventh test parameter and the initial offset cancellation signal, and an output terminal thereof outputting the second tail terminal offset cancellation signal; and a sixteenth AND gate, two input terminals thereof respectively receiving the eighth test parameter and the initial offset cancellation signal, and an output terminal thereof outputting the first tail terminal offset cancellation signal.

16. The memory according to claim 4, wherein the bit line in the non-edge memory array tile is coupled to a respective local data line through a respective column gating switch;

local data lines coupled to the second bit line in a non-edge odd-numbered memory array tile and the first bit line in a non-edge even-numbered memory array tile are further connected to a first precharge power supply through respective second test switches; and local data lines coupled to the first bit line in the non-edge odd-numbered memory array tile and the second bit line in the non-edge even-numbered memory array tile are further connected to a second precharge power supply through respective second test switches.

17. The memory according to claim 16, wherein the first bit line in the edge memory array tile is coupled to a respective local data line through a respective column gating switch;

for the edge memory array tile, a local data line coupled to the odd-numbered first bit line is coupled to a second precharge power supply through the second test switch, and a local data line coupled to the even-numbered first bit line is coupled to a first precharge power supply through the second test switch;

or for a first memory array tile, a local data line coupled to the odd-numbered first bit line is coupled to a second precharge power supply through the second test switch, and a local data line coupled to the even-numbered first bit line is coupled to a first precharge power supply through the second test switch, and for a last memory array tile, a local data line coupled to the odd-numbered first bit line is coupled to a first precharge power supply through the second test switch, and a local data line coupled to the even-numbered first bit line is coupled to a second precharge power supply through the second test switch.

18. The memory according to claim 17, wherein the memory is configured to control all isolation switches, offset cancellation switches, and precharge switches to be in an off state, control all column gating switches and second test switches to be in an on state, and control the first precharge power supply to be at a first voltage value and the second precharge power supply to be at a second voltage value, to perform one time of bit line stress test; or control all isolation switches, offset cancellation switches, and precharge switches to be in an off state, control all column gating switches and second test switches to be in an on state, and control the first precharge power supply to be at a second voltage value and the second precharge power supply to be at a first voltage value, to perform another time of bit line stress test.

19. The memory according to claim 5, wherein each bit line in the non-edge memory array tile is coupled to a respective local data line through a respective column gating switch;

local data lines coupled to the second bit line in a non-edge odd-numbered memory array tile and the first bit line in a non-edge even-numbered memory array tile are coupled to a first preset test power supply through the second test switches; and local data lines coupled to the first bit line in the non-edge odd-numbered memory array tile and the second bit line in the non-edge even-numbered memory array tile are coupled to a second preset test power supply through the second test switches.

20. The memory according to claim 19, wherein the first bit line in the edge memory array tile is coupled to a respective local data line through a respective column gating switch;

for the edge memory array tile, a local data line corresponding to the odd-numbered first bit line is coupled to a second preset test power supply through the second test switch, and a local data line corresponding to the even-numbered first bit line is coupled to a first preset test power supply through the second test switch;

or for a first memory array tile, a local data line corresponding to the odd-numbered first bit line is coupled to a second preset test power supply through the second test switch, and a local data line corresponding to the even-numbered first bit line is coupled to a first preset test power supply through the second test switch, and for a last memory array tile, a local data line corresponding to the odd-numbered first bit line is coupled to a first preset test power supply through the second test switch, and a local data line corresponding to the even-numbered first bit line is coupled to a second preset test power supply through the second test switch.

21. The memory according to claim 20, wherein the memory is configured to: control all isolation switches and offset cancellation switches to be in an off state, control all precharge switches to be in an on state, and control the precharge power supply to be at a fifth voltage value; and control all column gating switches and second test switches to be in an on state, and control the first preset test power supply to be at a first voltage value and the second preset test power supply to be at a second voltage value, to perform one time of bit line stress test; or control all isolation switches and offset cancellation switches to be in an off state, control all precharge switches to be in an on state, and control the precharge power supply to be at a fifth voltage value; and control all column gating switches and second test switches to be in an on state, and control the first preset test power supply to be at a second voltage value and the second preset test power supply to be at a first voltage value, to perform another time of bit line stress test; and a voltage of the fifth voltage value is located between a voltage of the first voltage value and a voltage of the second voltage value.

* * * * *